(12) United States Patent
Sakuma et al.

(10) Patent No.: US 9,076,722 B2
(45) Date of Patent: Jul. 7, 2015

(54) NONVOLATILE SEMICONDUCTOR MEMORY DEVICE

(75) Inventors: Kiwamu Sakuma, Yokohama (JP); Masahiro Kiyotoshi, Yokkaichi (JP); Atsuhiro Kinoshita, Kamakura (JP); Haruka Kusai, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 53 days.

(21) Appl. No.: 13/547,567

(22) Filed: Jul. 12, 2012

(65) Prior Publication Data

US 2013/0181184 A1 Jul. 18, 2013

(30) Foreign Application Priority Data

Jul. 15, 2011 (JP) ................. 2011-157158

(51) Int. Cl.
| | |
|---|---|
| H01L 29/76 | (2006.01) |
| H01L 29/788 | (2006.01) |
| H01L 29/66 | (2006.01) |
| H01L 29/792 | (2006.01) |
| H01L 27/24 | (2006.01) |
| H01L 21/8234 | (2006.01) |
| H01L 27/115 | (2006.01) |
| H01L 27/22 | (2006.01) |
| H01L 21/84 | (2006.01) |
| H01L 27/12 | (2006.01) |
| H01L 27/06 | (2006.01) |

(52) U.S. Cl.
CPC .... *H01L 27/2481* (2013.01); *H01L 21/823431* (2013.01); *H01L 27/0688* (2013.01); *H01L 29/7881* (2013.01); *H01L 29/792* (2013.01); *H01L 27/11519* (2013.01); *H01L 27/11524* (2013.01); *H01L 27/11551* (2013.01); *H01L 27/11565* (2013.01); *H01L 27/1157* (2013.01); *H01L 27/11578* (2013.01); *H01L 27/222* (2013.01); *H01L 21/845* (2013.01); *H01L 27/1211* (2013.01)

(58) Field of Classification Search
None
See application file for complete search history.

(56) References Cited

U.S. PATENT DOCUMENTS

| | | | |
|---|---|---|---|
| 2008/0073635 | A1* | 3/2008 | Kiyotoshi et al. ............... 257/2 |
| 2010/0226195 | A1 | 9/2010 | Lue |
| 2011/0049611 | A1 | 3/2011 | Kiyotoshi et al. |
| 2012/0068241 | A1 | 3/2012 | Sakuma et al. |
| 2012/0068254 | A1* | 3/2012 | Sakuma et al. ............. 257/324 |
| 2012/0139030 | A1 | 6/2012 | Sakuma et al. |

FOREIGN PATENT DOCUMENTS

| | | |
|---|---|---|
| JP | 2-74069 | 3/1990 |
| JP | 2010-166055 | 7/2010 |

OTHER PUBLICATIONS

U.S. Appl. No. 13/366,845, filed Feb. 6, 2012, Masahiro Kiyotoshi, et al.

(Continued)

*Primary Examiner* — Mamadou Diallo
*Assistant Examiner* — Jay C Chang
(74) *Attorney, Agent, or Firm* — Oblon, McClelland, Maier & Neustadt, L.L.P.

(57) ABSTRACT

According to one embodiment, a nonvolatile semiconductor memory device includes fin-type stacked layer structures. Each of the structures includes semiconductor layers stacked in a perpendicular direction. Assist gate electrodes are disposed in an in-plane direction and divided on a surface in the perpendicular direction of the structures.

19 Claims, 33 Drawing Sheets

(56) References Cited

OTHER PUBLICATIONS

A. Hubert, et al., "A stacked SONOS technology, up to 4 levels and 6nm crystalline nanowires, with gate-all-around or independent gates (Φ-Flash), suitable for full 3D integration", IEDM, 2009, pp. 637-640.

Hang-Ting Lue, et al., "A Highly Scalable 8-Layer 3D Vertical-Gate (VG) TFT NAND Flash Using Junction-Free Buried Channel BE-SONOS Device", Symposium on VLSI Technology Digest of Technical Papers, 2010, pp. 131-132.

U.S. Appl. No. 13/622,612, filed Sep. 19, 2012, Fujii et al.

U.S. Appl. No. 13/622,644, filed Sep. 19, 2012, Fujii et al.

Office Action issued Sep. 2, 2014 in Japanese Patent Application No. 2011-157158 (with English translation).

* cited by examiner

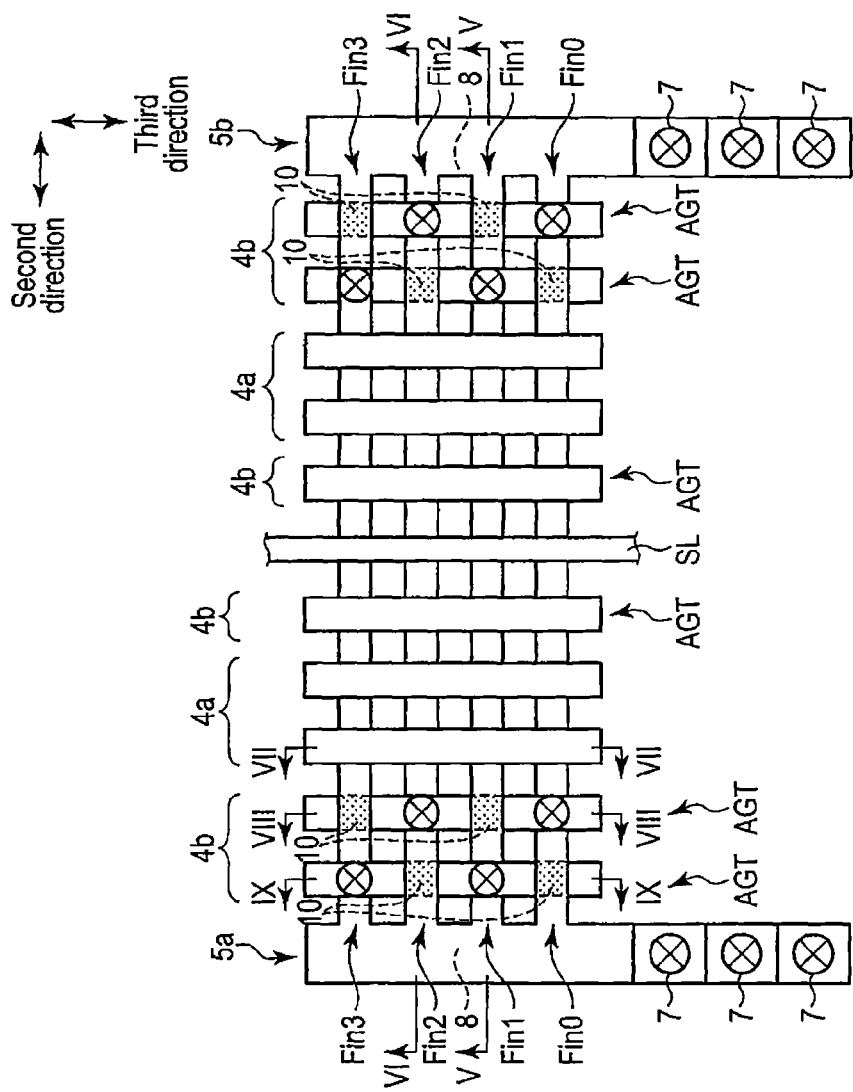
F I G. 4

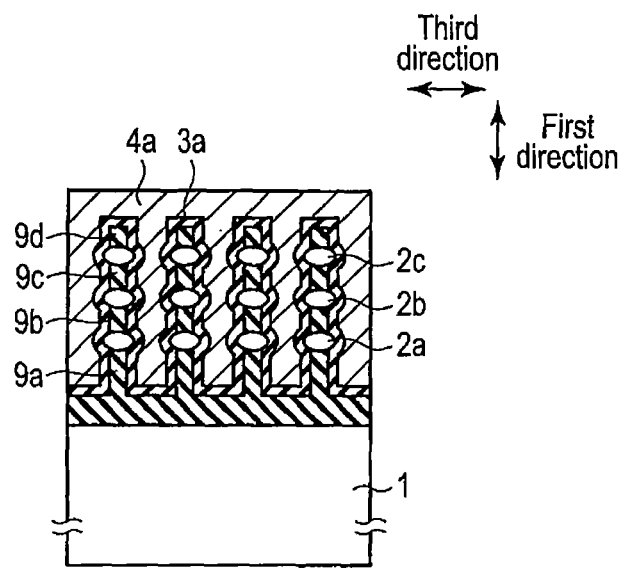
F I G. 7
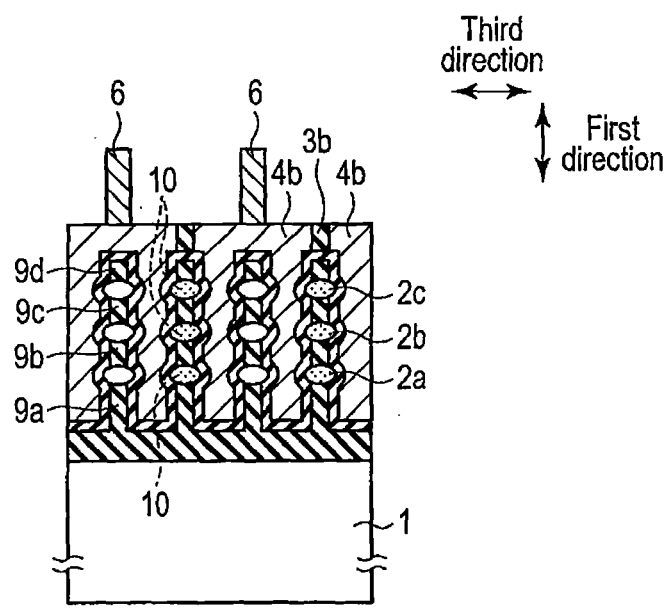
F I G. 8

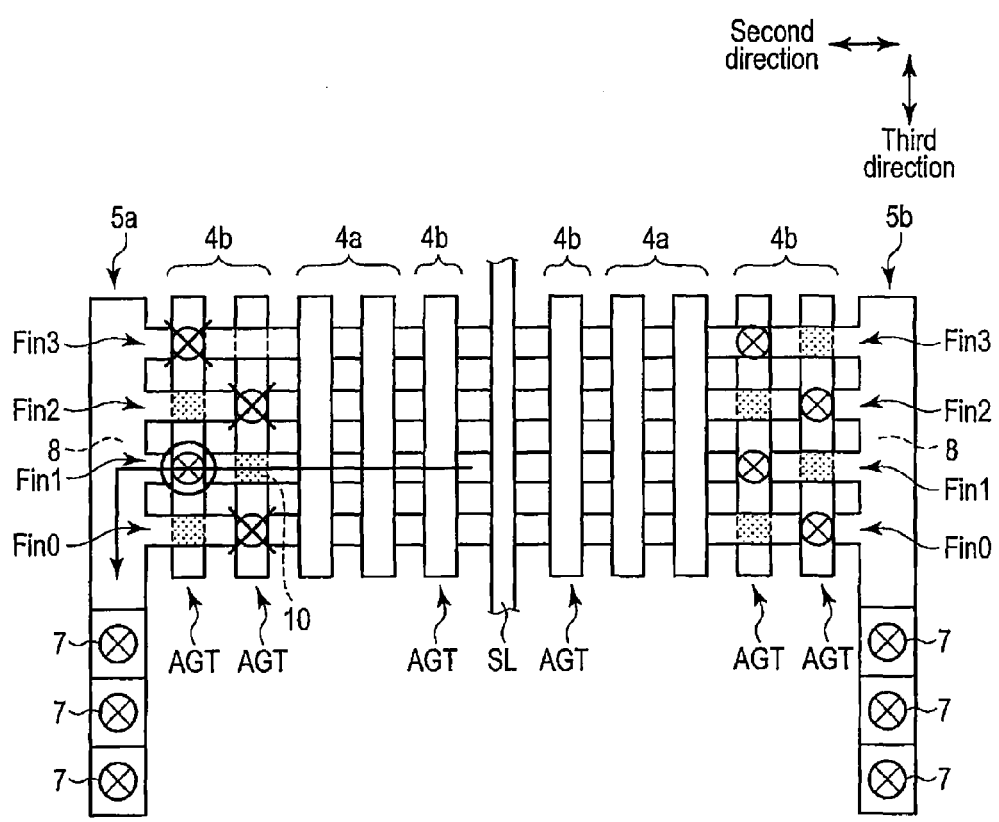
F I G. 11

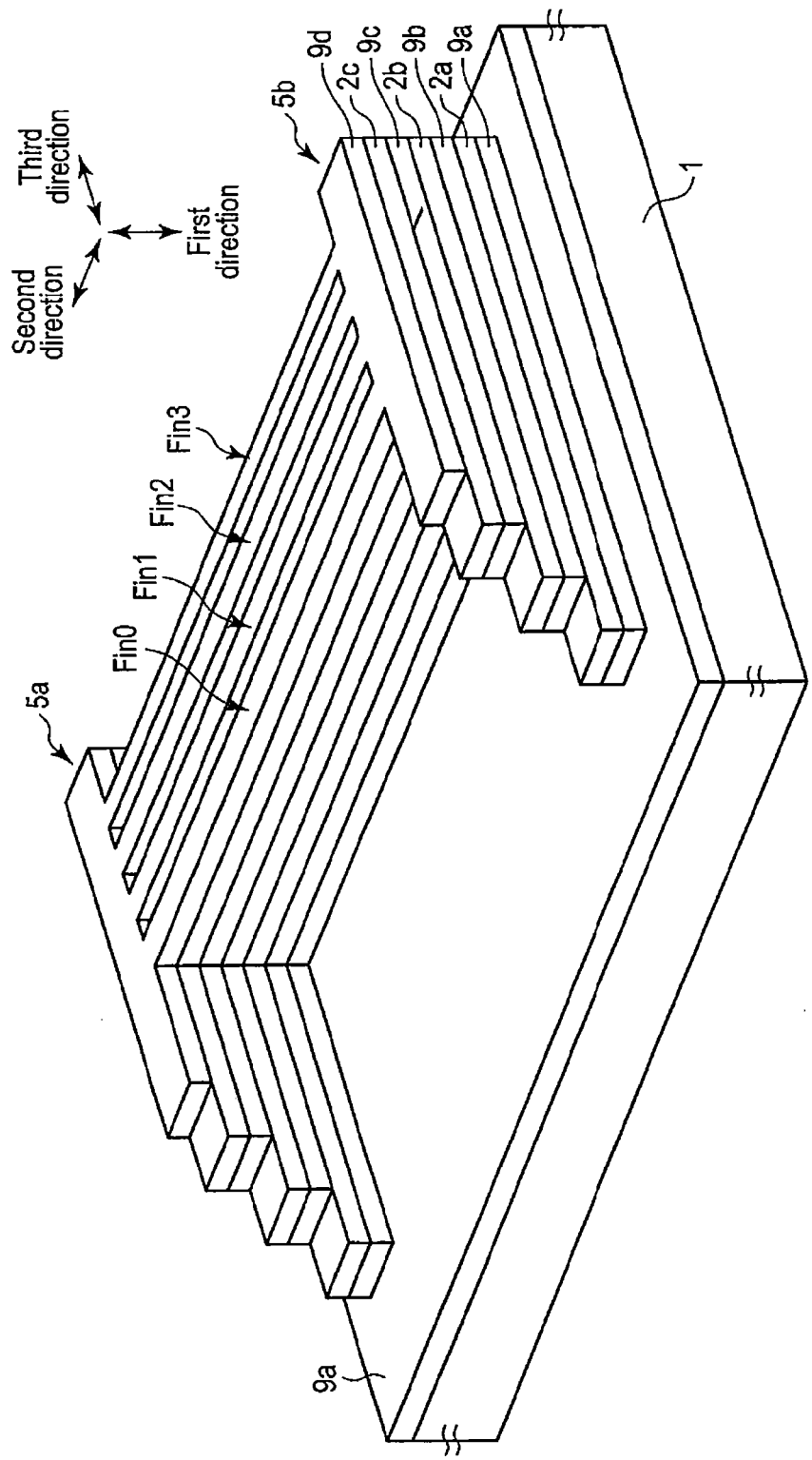
F I G. 14

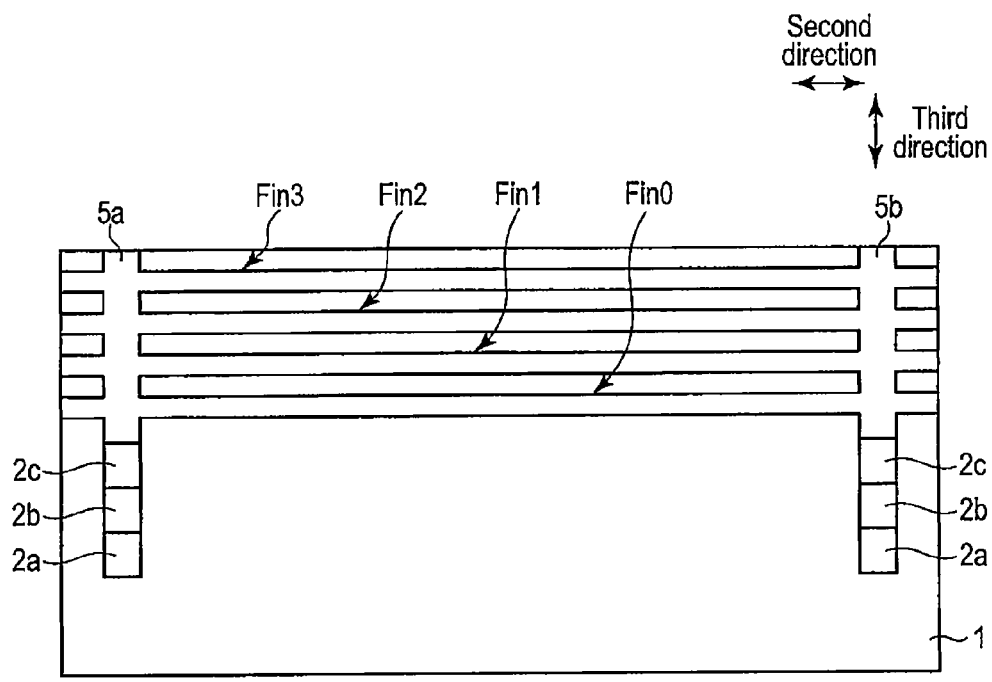
F I G. 15
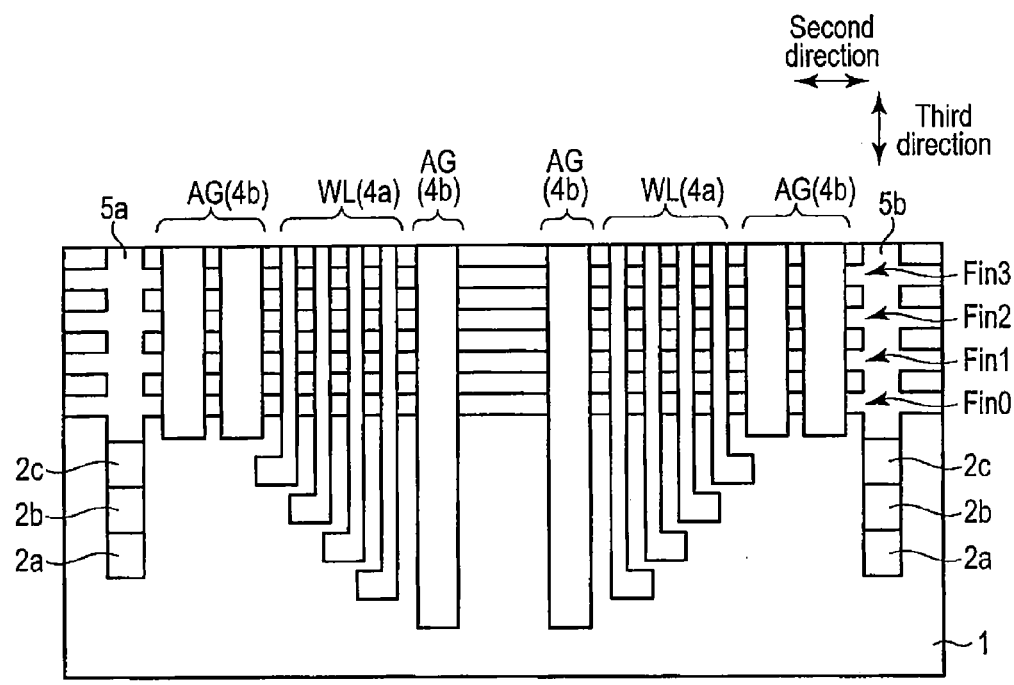
F I G. 16

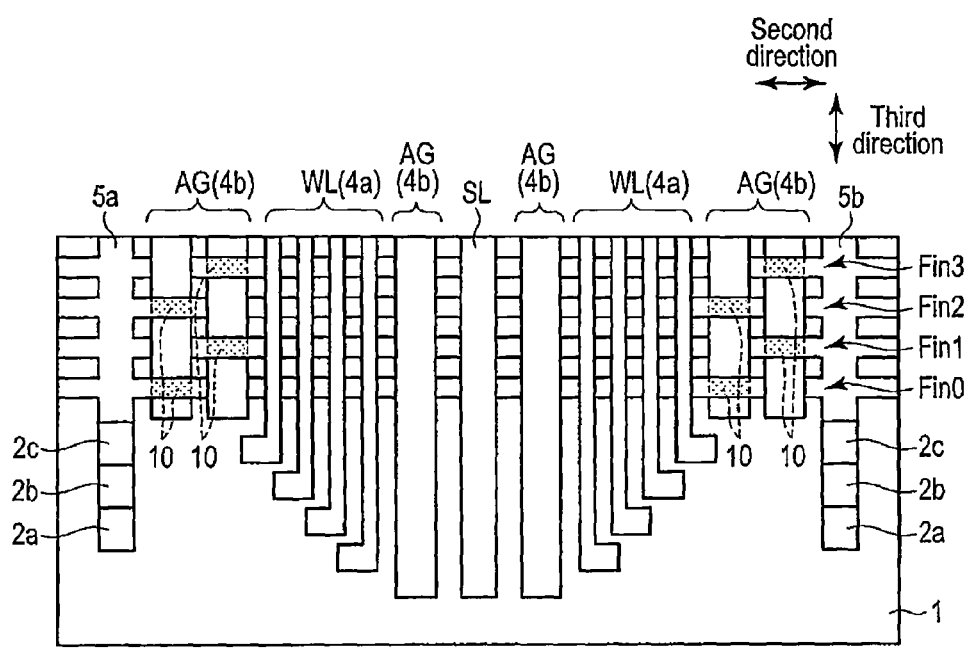
F I G. 19

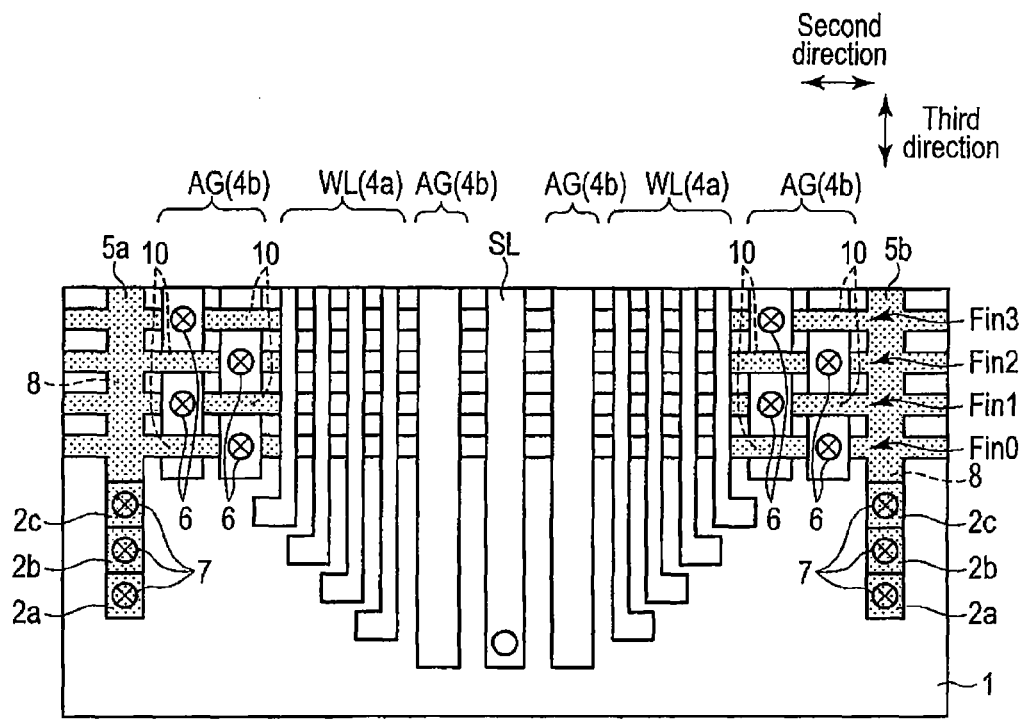
F I G. 21
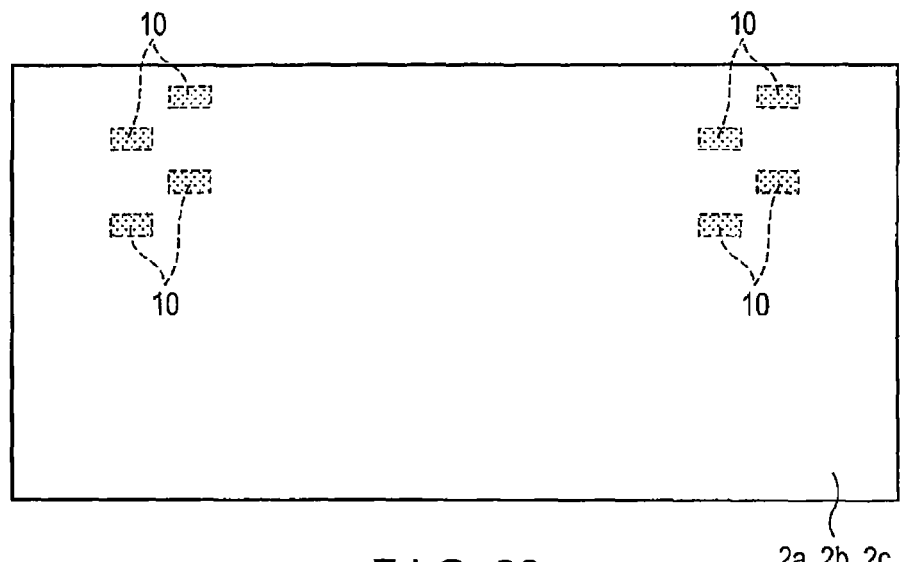
F I G. 22

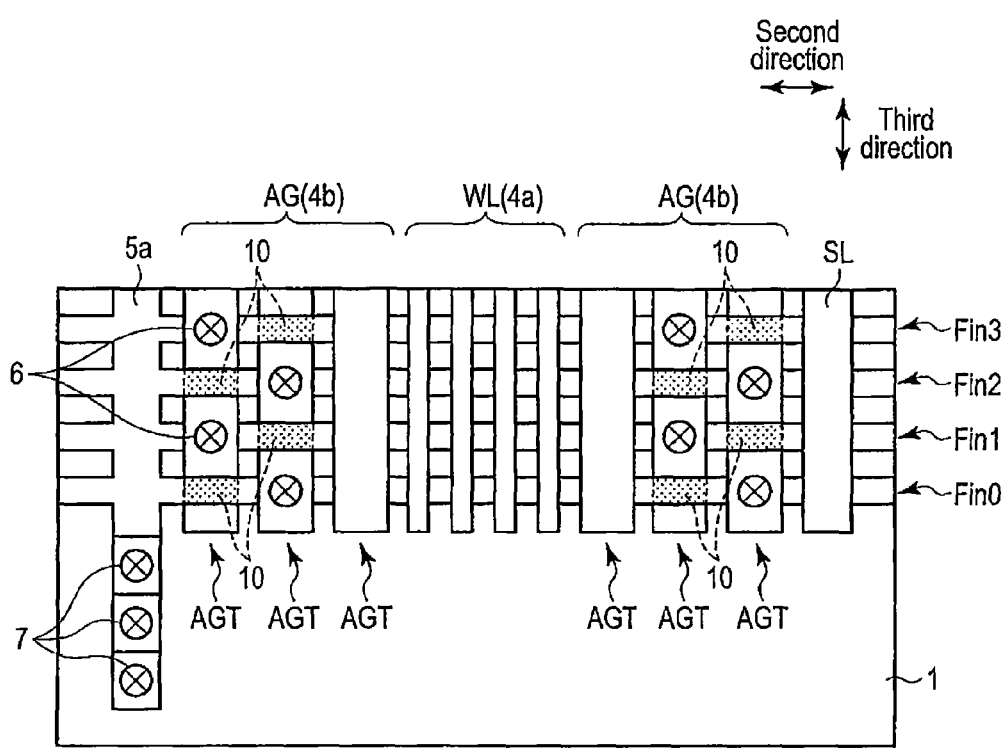
F I G. 28

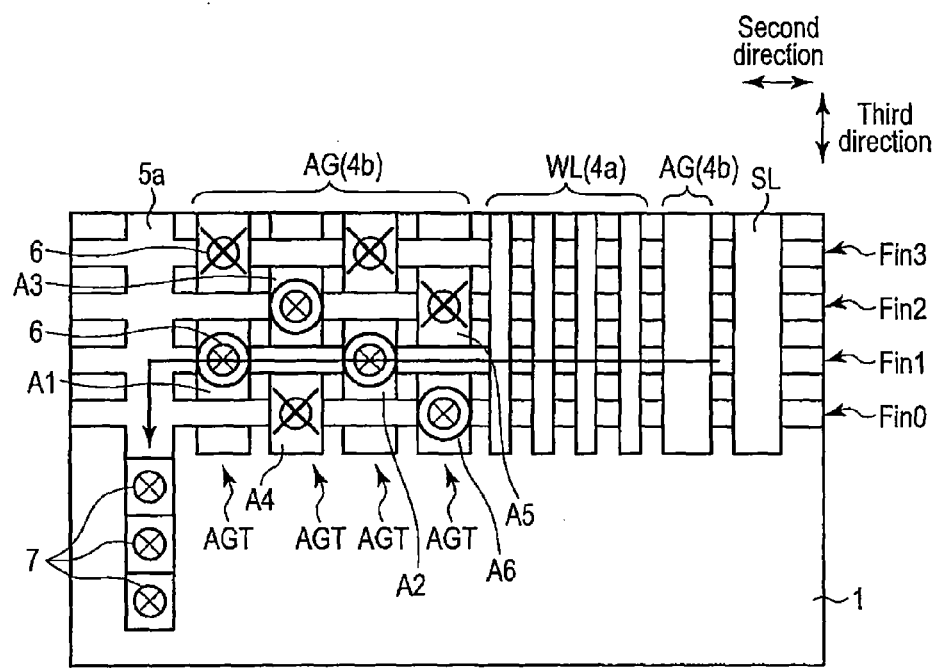
F I G. 31

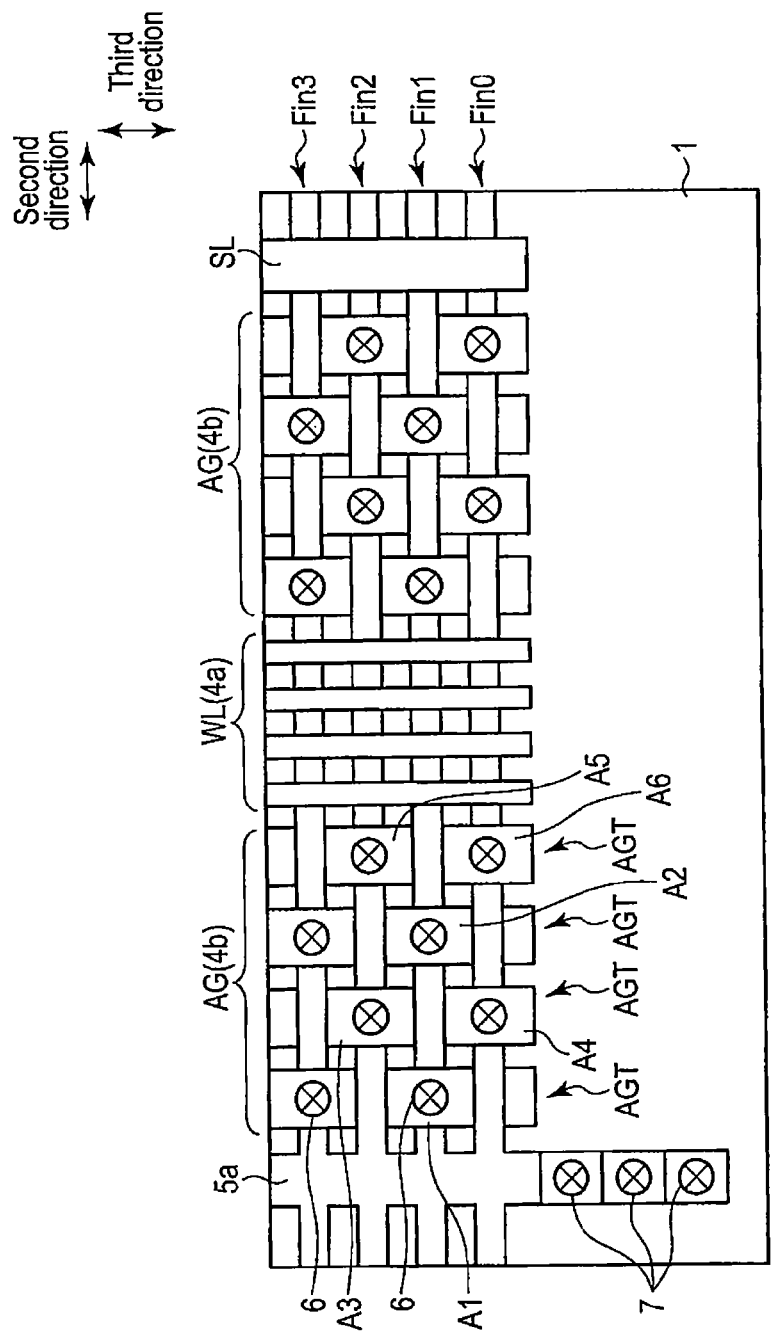
F I G. 32

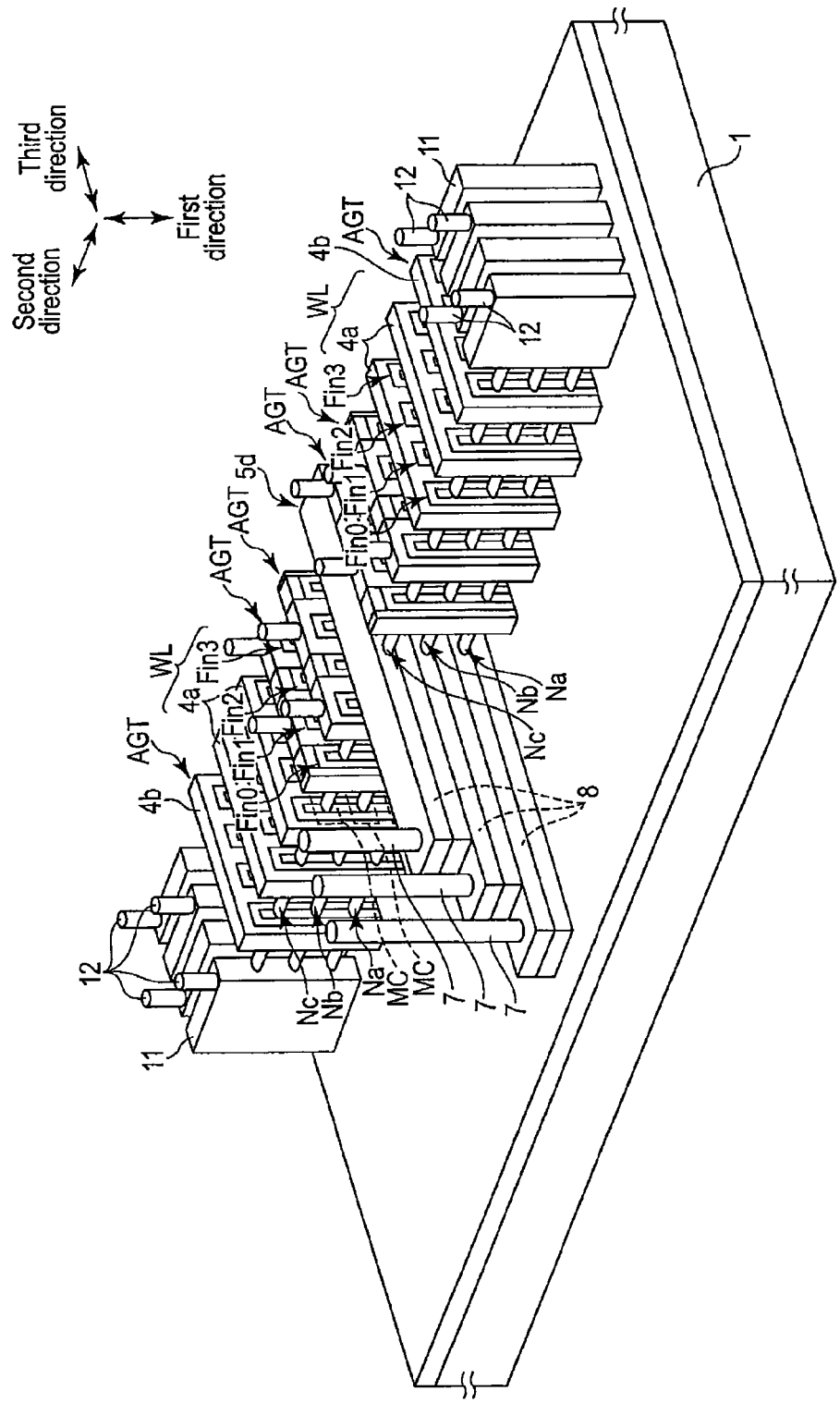
F I G. 34

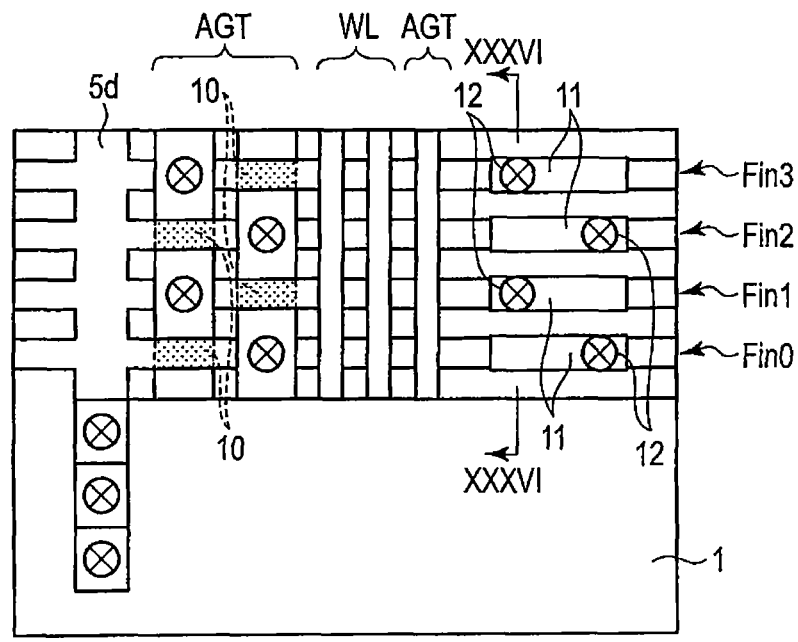
F I G. 35
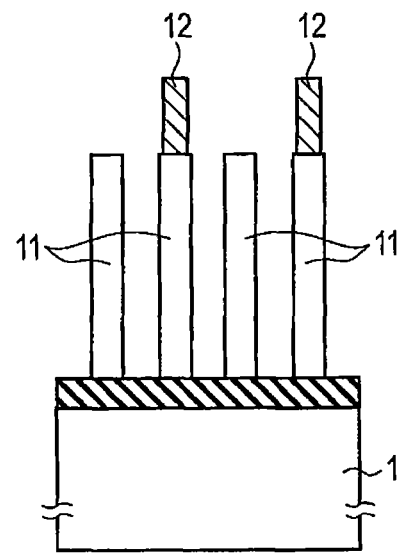
F I G. 36

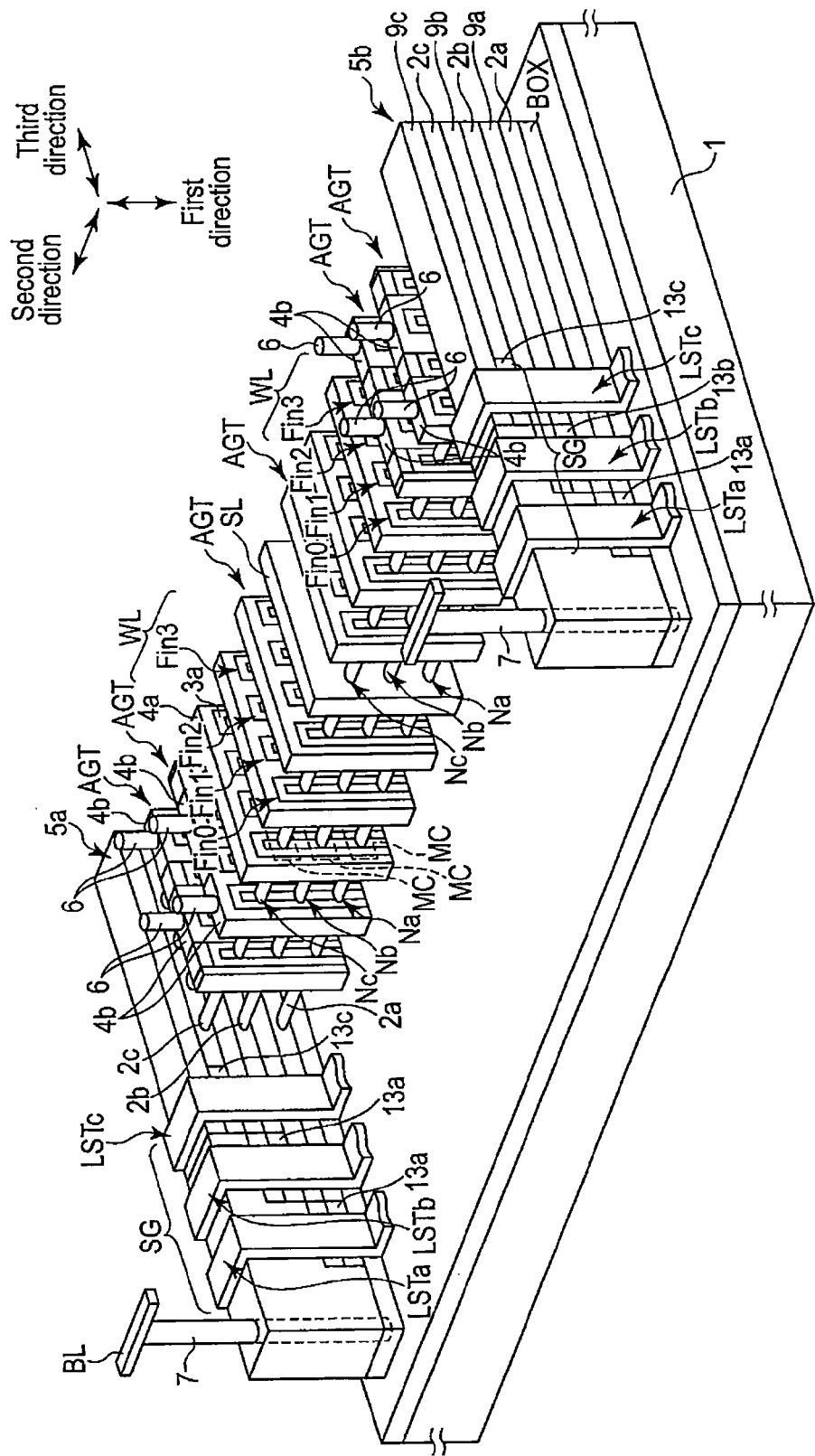
F I G. 37

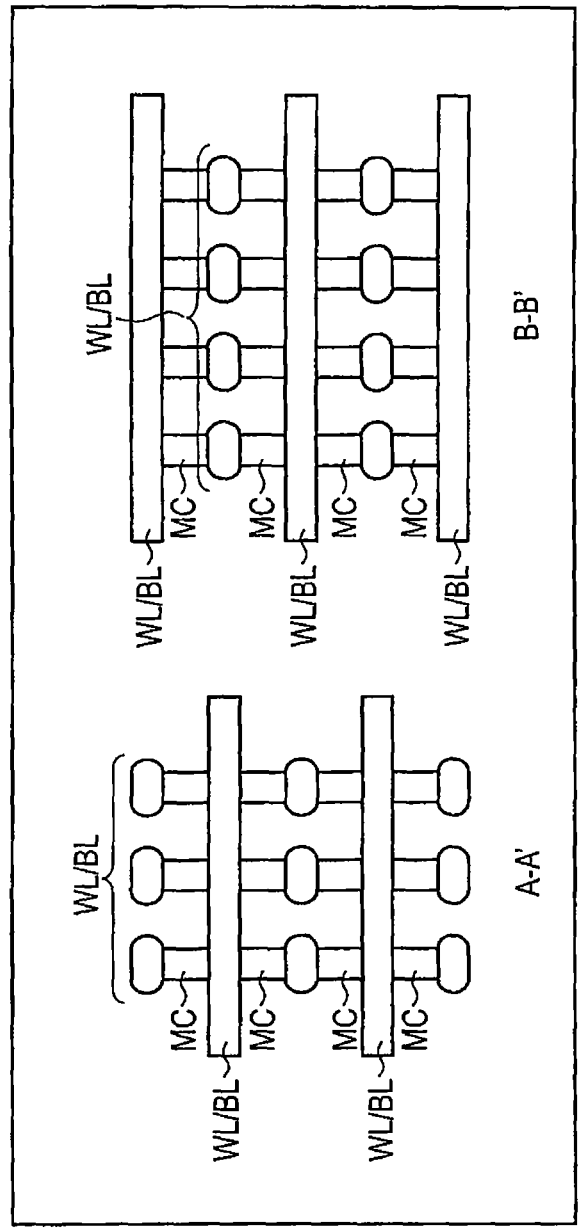
F I G. 41

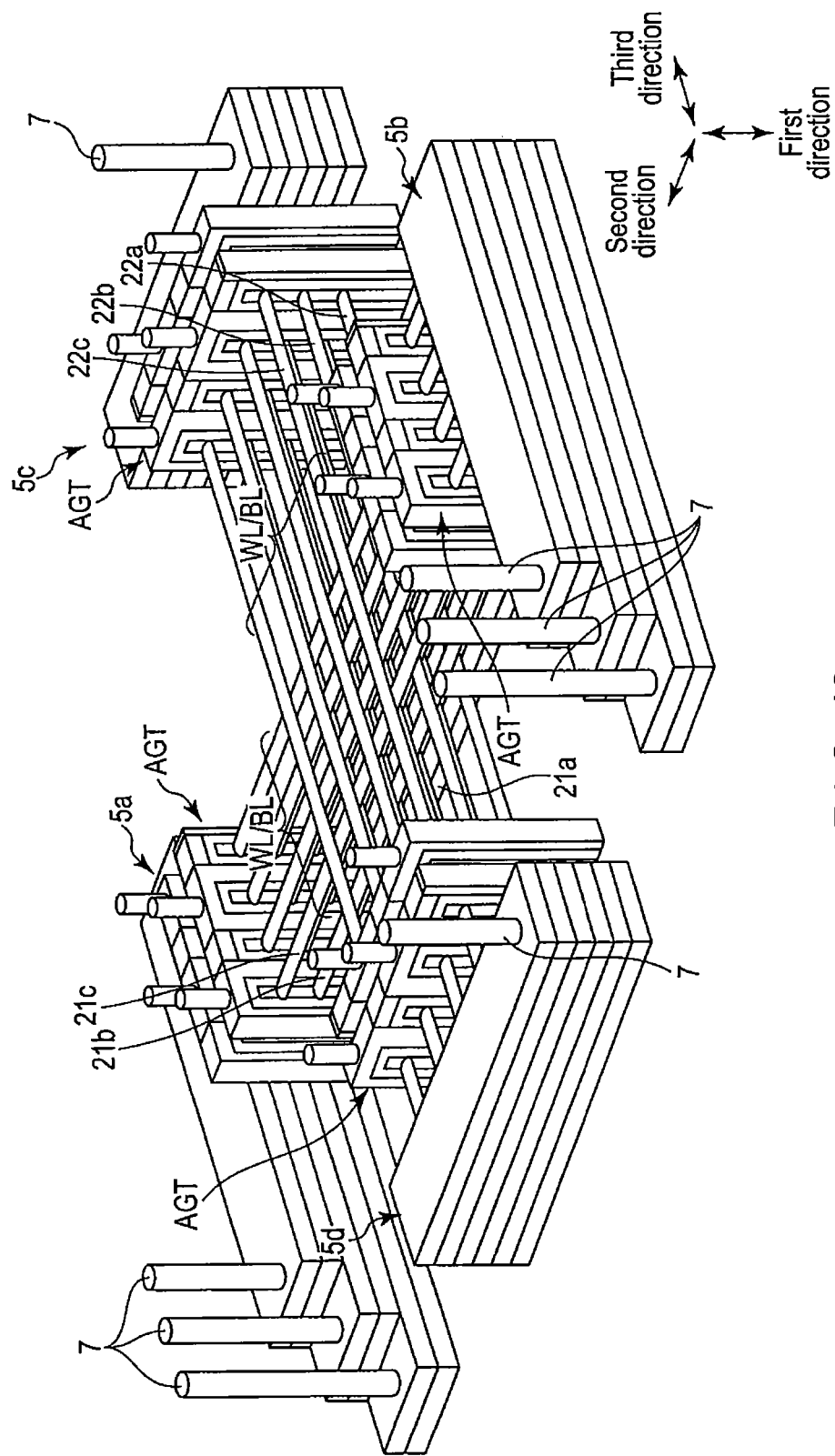
F I G. 43

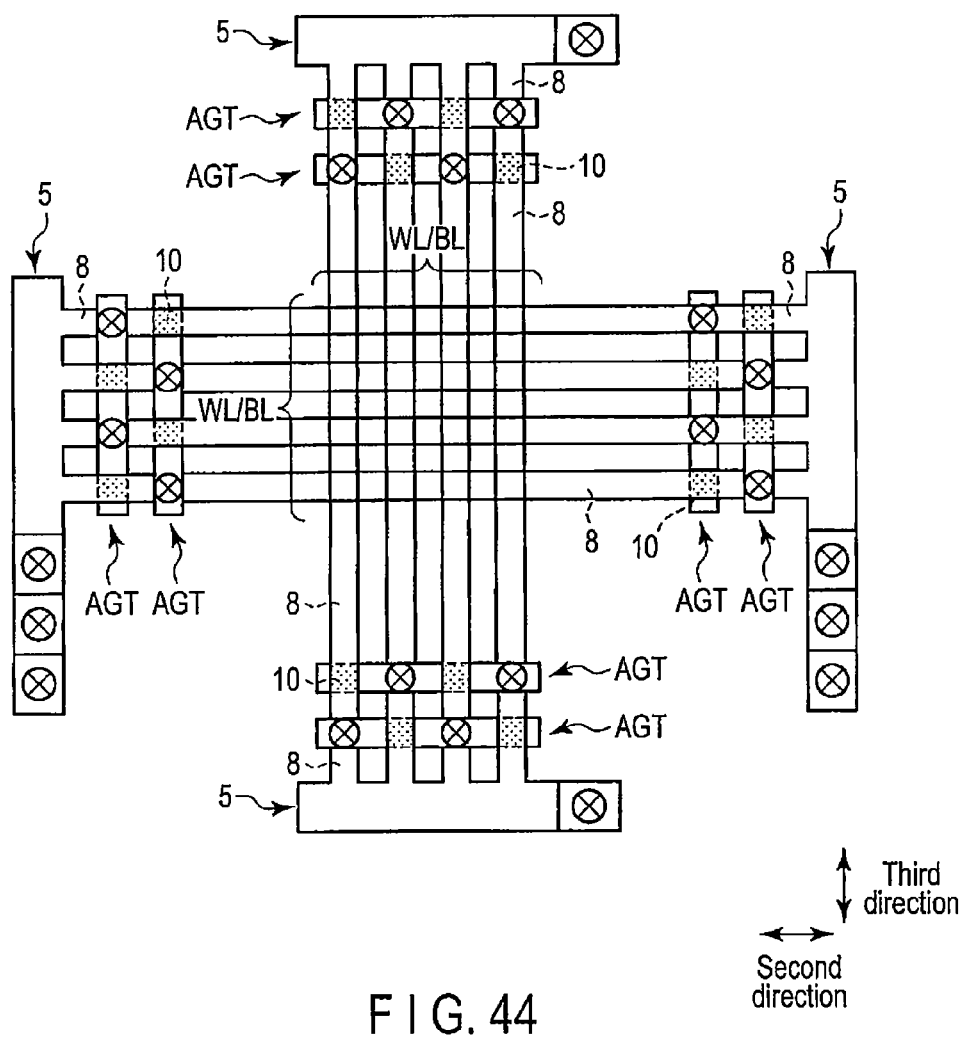
F I G. 44

NONVOLATILE SEMICONDUCTOR MEMORY DEVICE

CROSS-REFERENCE TO RELATED APPLICATIONS

This application is based upon and claims the benefit of priority from prior Japanese Patent Application No. 2011-157158, filed Jul. 15, 2011, the entire contents of which are incorporated herein by reference.

FIELD

Embodiments described herein relate generally to a nonvolatile semiconductor memory device and a method of manufacturing the same.

BACKGROUND

For higher integration and higher capacity of a nonvolatile semiconductor memory device, it is necessary to reduce design rules. In order to reduce the design rules, enhanced micro fabrication of wiring patterns or the like is needed. This, however, requires an extremely high level of fabrication technique, so that the reduction of the design rules has become increasingly difficult.

Accordingly, nonvolatile semiconductor memory devices having three-dimensional structures have recently been suggested for higher integration of memory cells.

A common feature of these nonvolatile semiconductor memory devices is that a fin type stacked layer structure is obtained by a semiconductor substrate and memory strings. The memory strings are stacked in a first direction perpendicular to the surface of the semiconductor substrate, and extend in a second direction parallel to the surface of the semiconductor substrate. The memory strings comprise memory cells connected in series in the second direction. One end of the fin type stacked layer structure in the second direction is connected to a beam extending in a third direction perpendicular to the first and second directions. The beam has a function to prevent the collapse of the fin type stacked layer structure. A function of selecting one of the memory strings is added to a part of the beam.

According to such a structure, theoretically, integration can be enhanced by the increase of the number of stacked memory strings and by the reduction of the fin width (width in the third direction) of the fin type stacked layer structure.

However, when the fin type stacked layer structures are connected to one beam, an assist gate transistor for selecting one of the fin type stacked layer structures is added to each of the fin type stacked layer structures. The assist gate transistor needs to be independently operated for each of the fin type stacked layer structures. Therefore, assist gate electrodes also have to be separated from one another for the respective fin type stacked layer structures.

The assist gate electrodes are separated, for example, by photolithography and RIE. However, when the assist gate electrodes are separated from one another in the fin type stacked layer structures, the distance (space in the third direction) between the fin type stacked layer structures needs to be great enough to pattern the assist gate electrode. Accordingly, it is difficult to sufficiently reduce the distance. Thus, the integration of the nonvolatile semiconductor memory device cannot be sufficiently enhanced.

BRIEF DESCRIPTION OF THE DRAWINGS

FIG. 4 is a plan view of FIG. 3;
FIG. 7 is a sectional view taken along the line VII-VII of FIG. 4;
FIG. 8 is a sectional view taken along the line VIII-VIII of FIG. 4;
FIG. 11 is a diagram showing the operation of selecting a fin type stacked layer structure;
FIG. 12 to FIG. 23 are diagrams showing a method of manufacturing the structure shown in FIG. 3;
FIG. 28 is a diagram showing a fifth modification;
FIG. 31 is a diagram showing the operation of selecting a fin type stacked layer structure;
FIG. 32 is a diagram showing a seventh modification;
FIG. 33 and FIG. 34 are diagrams showing another modification;
FIG. 35 is a plan view of FIG. 34;
FIG. 36 is a sectional view taken along the line XXXVI-XXXVI of FIG. 35;
FIG. 37 is a diagram showing another modification;
FIG. 41 is a sectional view of FIG. 40;
FIG. 42 and FIG. 43 are diagrams showing a modification of the structure shown in FIG. 38;
and
FIG. 44 is a plan view of FIG. 43.

DETAILED DESCRIPTION

Figure 1:
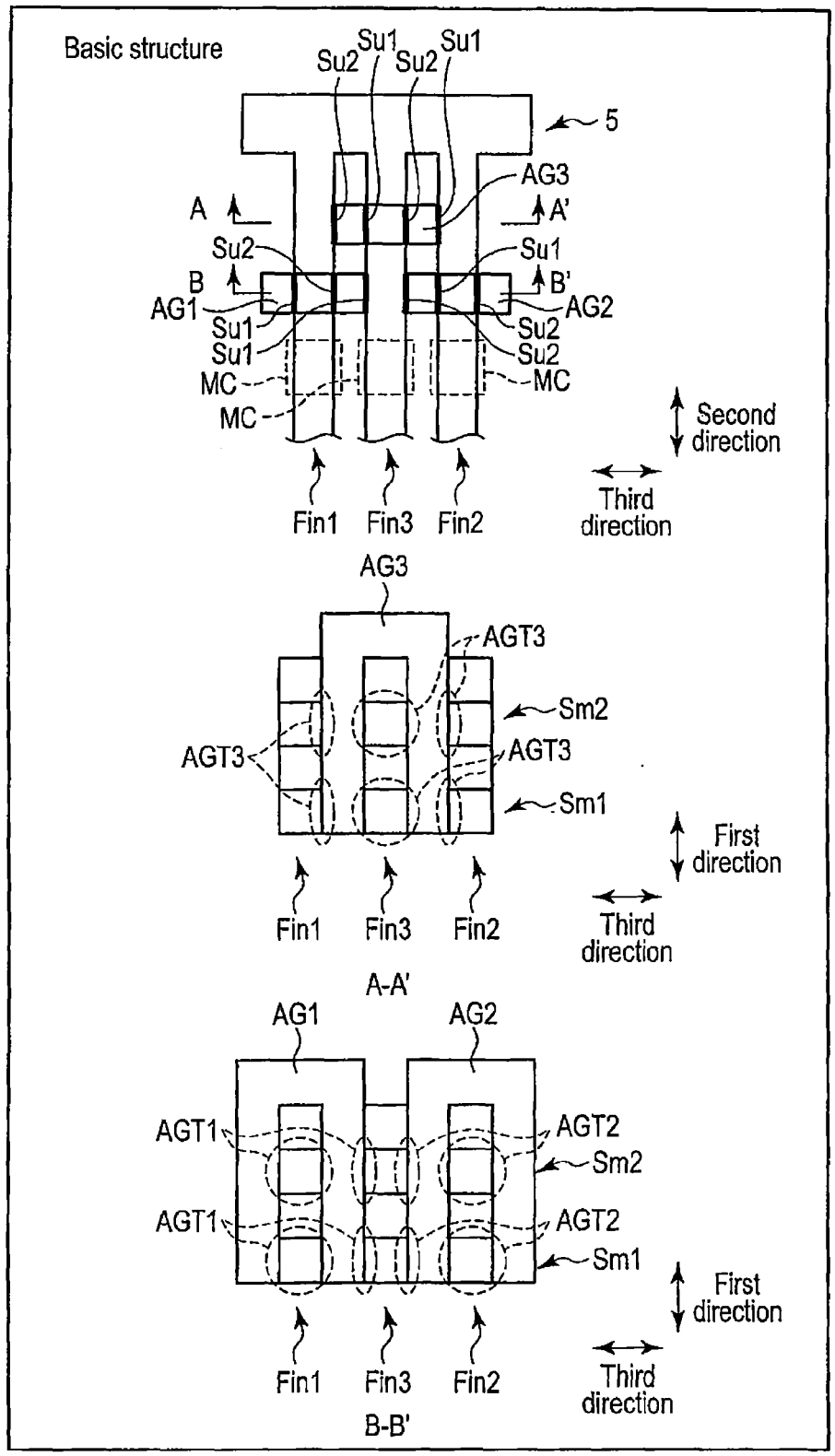
FIG. 1 is a diagram showing a basic configuration.

In general, according to one embodiment, a nonvolatile semiconductor memory device comprises: a semiconductor substrate; first to third fin type stacked layer structures which each have first and second memory cells stacked in a first direction perpendicular to the surface of the semiconductor substrate and which each extend in a second direction parallel to the surface of the semiconductor substrate and which are arranged in a third direction perpendicular to the first and second directions, the third fin type stacked layer structure provided between the first and second fin type stacked layer structure; a first assist gate transistor which comprises a first assist gate electrode covering first and second surfaces of the first fin type stacked layer structure facing each other in the third direction and a first surface of the third fin type stacked layer structure facing the first and second surfaces of the first fin type stacked layer structure in the third direction; a second assist gate transistor which comprises a second assist gate electrode covering first and second surfaces of the second fin type stacked layer structure facing each other in the third direction and a second surface of the third fin type stacked layer structure facing the first and second surfaces of the second fin type stacked layer structure in the third direction;

and a third assist gate transistor which comprises a third assist gate electrode covering the first and second surfaces of the third fin type stacked layer structure facing each other in the third direction, the second surface of the first fin type stacked layer structure, and the first surface of the second fin type stacked layer structure, wherein each of first to third fin type stacked layer structures comprises first and second semiconductor layers stacked in the first direction, the first and second memory cells are provided in corresponding to the first and second semiconductor layers, the first and second assist gate electrodes are arranged side by side in the third direction, and are divided from each other on the surface of the third fin type stacked layer structure facing the surface of the semiconductor substrate in the first direction, the first assist gate transistor has a double gate structure in the first fin type stacked layer structure, and has a single gate structure in the third fin type stacked layer structure, the second assist gate transistor has the double gate structure in the second fin type stacked layer structure, and has the single gate structure in the third fin type stacked layer structure, and the third assist gate transistor has the double gate structure in the third fin type stacked layer structure, and has the single gate structure in the first and second fin type stacked layer structures.

Hereinafter, an embodiment will be described with reference to the drawings.

Like components are provided with like reference numerals throughout the embodiment below and are not repeatedly described. The drawings are schematic diagrams for explaining the embodiment and serve for the understanding of the same. In these drawings, the shapes, dimensions, and ratios are different in some parts from those of an actual device, but can be suitably designed and changed taking the following explanation and known techniques into consideration.

1. Basic Structure

The embodiment suggests the layout of assist gate transistors effective in enhancing integration in a nonvolatile semiconductor memory device (e.g., vertical gate ladder-bit cost scalable memory) in which memory cells are transformed into a three-dimensional form by fin type stacked layer structures and in which one of the fin type stacked layer structures is selected by the assist gate transistors.

FIG. 1 shows a basic configuration of the nonvolatile semiconductor memory device.

First to third fin type stacked layer structures Fin1, Fin2, and Fin3 each have first and second memory cells MC stacked in a first direction perpendicular to the surface of a semiconductor substrate, extend in a second direction parallel to the surface of semiconductor substrate, and are arranged side by side in a third direction perpendicular to the first and second directions.

First assist gate electrode AG1 of first assist gate transistor AGT1 covers first and second surfaces Su1 and Su2 of first fin type stacked layer structure Fin1 in the third direction, and first surface Su1 of third fin type stacked layer structure Fin3 in the third direction.

Second assist gate electrode AG2 of second assist gate transistor AGT2 covers first and second surfaces Su1 and Su2 of second fin type stacked layer structure Fin2 in the third direction, and second surface Su2 of third fin type stacked layer structure Fin3 in the third direction.

Third assist gate electrode AG3 of third assist gate transistor AGT3 covers first and second surfaces Su1 and Su2 of third fin type stacked layer structure Fin1 in the third direction, second surface Su2 of first fin type stacked layer structure Fin1 in the third direction, and first surface Su1 of second fin type stacked layer structure Fin2 in the third direction.

Each of first to third fin type stacked layer structures Fin1, Fin2, and Fin3 comprises first and second semiconductor layers Sm1 and Sm2 stacked in the first direction.

First and second assist gate electrodes AG1 and AG2 are arranged side by side in the third direction, and are divided from each other on the surface of third fin type stacked layer structure Fin3 in the first direction.

The following characteristics are provided; first assist gate transistor AGT1 is formed in first and third fin type stacked layer structures Fin1 and Fin3, second assist gate transistor AGT2 is formed in second and third fin type stacked layer structures Fin2 and Fin3, and third assist gate transistor AGT3 is formed in first to third fin type stacked layer structures Fin1, Fin2, and Fin3.

For example, first assist gate transistor AGT1 is formed, as an FET having a double gate structure, on first and second surfaces Su1 and Su2 of first and second semiconductor layers Sm1 and Sm2 in first fin type stacked layer structure Fin1 in the third direction. First assist gate transistor AGT1 is also formed, as an FET having a single gate structure, on first surface Su1 of first and second semiconductor layers Sm1 and Sm2 in third fin type stacked layer structure Fin3 in the third direction.

Second assist gate transistor AGT2 is formed, as an FET having a double gate structure, on first and second surfaces Su1 and Su2 of first and second semiconductor layers Sm1 and Sm2 in second fin type stacked layer structure Fin2 in the third direction. Second assist gate transistor AGT2 is also formed, as an FET having a single gate structure, on second surface Su2 of first and second semiconductor layers Sm1 and Sm2 in third fin type stacked layer structure Fin3 in the third direction.

Third assist gate transistor AGT3 is formed, as an FET having a double gate structure, on first and second surfaces Su1 and Su2 of first and second semiconductor layers Sm1 and Sm2 in third fin type stacked layer structure Fin3 in the third direction. Third assist gate transistor AGT3 is also formed, as an FET having a single gate structure, on second surface Su2 of first and second semiconductor layers Sm1 and Sm2 in first fin type stacked layer structure Fin1 in the third direction and on first surface Su1 of first and second semiconductor layers Sm1 and Sm2 in second fin type stacked layer structure Fin2 in the third direction.

According to such a structure, a conductive material located on the surface of third fin type stacked layer structure Fin3 in the first direction can be removed in order to divide, for example, first and second assist gate electrodes AG1 and AG2 arranged side by side in the third direction. Therefore, even if the space between first to third fin type stacked layer structures Fin1, Fin2, and Fin3 in the third direction is reduced for higher integration, there is no residue of the conductive material in the space.

This can solve the problem of wrong selection caused by faulty dividing of the assist gate electrodes resulting from the residue. As a result, the reliability of the nonvolatile semiconductor memory device can be improved.

In the space between first and third fin type stacked layer structures Fin1 and Fin3, the conductive material located between first assist gate electrode AG1 and third assist gate electrode AG3 is removed in a relatively wide space. Thus, there is no residue in this space.

Similarly, in the space between second and third fin type stacked layer structures Fin2 and Fin3, the conductive material located between second assist gate electrode AG2 and third assist gate electrode AG3 is removed in a relatively wide space. Thus, there is no residue in this space.

However, in the above-described layout of the assist gate transistors, first assist gate transistor AGT1 is formed in first and third fin type stacked layer structures Fin1 and Fin3. That is, if an on-potential (e.g., an "H (high)" level) is applied to first assist gate electrode AG1, a channel (conductive path) is formed in first and second semiconductor layers Sm1 and Sm2 within first and third fin type stacked layer structures Fin1 and Fin3. If an off-potential (e.g., an "L (low)" level) is applied to first assist gate electrode AG1, the channel (conductive path) in first and second semiconductor layers Sm1 and Sm2 within first and third fin type stacked layer structures Fin1 and Fin3 disappears.

Second assist gate transistor AGT2 is formed in second and third fin type stacked layer structures Fin2 and Fin3. That is, if an on-potential is applied to second assist gate electrode AG2, a channel is formed in first and second semiconductor layers Sm1 and Sm2 within second and third fin type stacked layer structures Fin2 and Fin3. If an off-potential is applied to second assist gate electrode AG2, the channel (conductive path) in first and second semiconductor layers Sm1 and Sm2 within second and third fin type stacked layer structures Fin2 and Fin3 disappears.

Third assist gate transistor AGT3 is formed in first to third fin type stacked layer structures Fin1, Fin2, and Fin3. That is, if an on-potential is applied to third assist gate electrode AG3, a channel is formed in first and second semiconductor layers Sm1 and Sm2 within first to third fin type stacked layer structures Fin1, Fin2, and Fin3. If an off-potential is applied to third assist gate electrode AG3, the channel (conductive path) in first and second semiconductor layers Sm1 and Sm2 within first to third fin type stacked layer structures Fin1, Fin2, and Fin3 disappears.

In view of such characteristics, according to the embodiment, for example, first and second memory cells MC in first and second fin type stacked layer structures Fin1 and Fin2 are effective, and first and second memory cells MC in third fin type stacked layer structure Fin3 are ineffective (dummy cells). Otherwise, first and second memory cells MC in first and second fin type stacked layer structures Fin1 and Fin2 may be ineffective (dummy cells), and first and second memory cells MC in third fin type stacked layer structure Fin3 may be effective.

However, it is not preferable from the viewpoint of higher integration that at least one of first to third fin type stacked layer structures Fin1, Fin2, and Fin3 is ineffective (dummy cells).

Thus, according to the embodiment, first and second semiconductor layers Sm1 and Sm2 in third fin type stacked layer structure Fin3 between first and second assist gate electrodes AG1 and AG2 are normally-on channels which are not dependent on the potentials of first and second assist gate electrodes AG1 and AG2. First and second semiconductor layers Sm1 and Sm2 in first and second fin type stacked layer structures Fin1 and Fin2 of third assist gate electrode AG3 in the third direction are the normally-on channels which are not dependent on the potential of third assist gate electrode AG3.

First and second semiconductor layers Sm1 and Sm2 in first fin type stacked layer structure Fin1 caught in first assist gate electrode AG1 are on/off channels which are dependent on the potential of first assist gate electrode AG1. First and second semiconductor layers Sm1 and Sm2 in second fin type stacked layer structure Fin2 caught in second assist gate electrode AG2 are the on/off channels which are dependent on the potential of second assist gate electrode AG2. First and second semiconductor layers Sm1 and Sm2 in third fin type stacked layer structure Fin3 caught in third assist gate electrode AG3 are the on/off channels which are dependent on the potential of third assist gate electrode AG3.

In this case, all first and second memory cells MC in first to third fin type stacked layer structures Fin1, Fin2, and Fin3 can be effective.

In order to form normally-on channels in first and second semiconductor layers Sm1 and Sm2, impurity regions are generally provided in first and second semiconductor layers Sm1 and Sm2.

Otherwise, the impurity regions do not have to be provided. For example, what is known as a fringe effect can be used. According to the fringe effect, if an on-potential is applied to third assist gate electrode AG3, an on-channel is formed in first and second semiconductor layers Sm1 and Sm2 within third fin type stacked layer structure Fin3 between first and second assist gate electrodes AG1 and AG2 even though first and second assist gate electrodes AG1 and AG2 have an off-potential.

The fringe effect is a phenomenon in which when the distance between gate electrodes (electrode pitch) is 30 nm or smaller, a current path is formed in a semiconductor layer (channel) by a fringe electric field from a gate electrode via an insulating layer even if no diffusion layer is formed between transistors connected in series. This is described in, for example, Chang-Hyum Lee et al., VLSI Technology Digest of Technical Papers, pp. 118-119, 2008.

In the meantime, in FIG. 1, beam 5 is connected to one end of each of first to third fin type stacked layer structures Fin1, Fin2, and Fin3 in the second direction, extends in the third direction, and comprises first and second semiconductor layers Sm1 and Sm2. Beam 5 is a common conductive path of first to third fin type stacked layer structures Fin1, Fin2, and Fin3, and has a function of preventing the collapse of these structures. This beam 5 is not an indispensable component.

Although first to third assist gate electrodes AG1, AG2, and AG3 are arranged zigzag between beam 5 and first and second memory cells MC in first to third fin type stacked layer structures Fin1, Fin2, and Fin3 in FIG. 1, the assist gate electrodes are not exclusively arranged in this manner.

For example, first and second assist gate electrodes AG1 and AG2 may be located at a first end of each of first and second memory cells MC in first to third fin type stacked layer structures Fin1, Fin2, and Fin3 in the second direction. Third assist gate electrode AG3 may be located at a second end of each of first and second memory cells MC in first to third fin type stacked layer structures Fin1, Fin2, and Fin3 in the second direction.

Each of first to third fin type stacked layer structures Fin1, Fin2, and Fin3 can be an FET that uses first and second semiconductor layers Sm1 and Sm2 as channels.

Each of first and second memory cells MC can be an FET which has a recording layer and a gate electrode and which uses first and second semiconductor layers Sm1 and Sm2 as channels and which changes in threshold in accordance with the state of the recording layer. In this case, the recording layer may be a charge storage layer having a charge storage function, or may be a resistance change layer whose resistance value changes in accordance with a voltage, a current, heat, a magnetic field, or the like.

When a third semiconductor layer extending in the third direction is further provided between first and second semiconductor layers Sm1 and Sm2, first memory cell MC can be a resistance change element disposed between the first and third semiconductor layers, and the second memory cell can be a resistance change element disposed between the second and third semiconductor layers.

Figure 2:
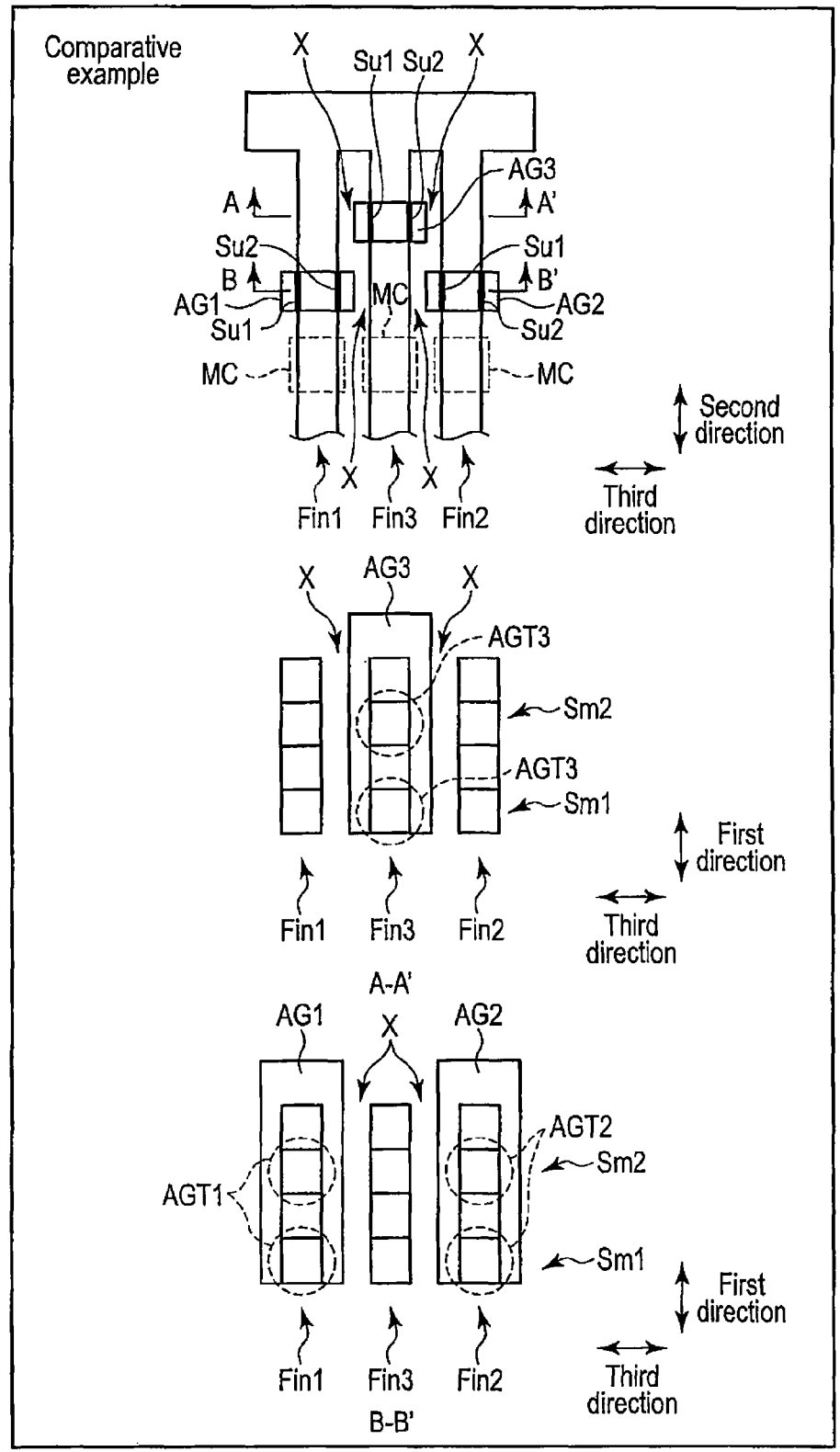
FIG. 2 is a diagram showing a comparative example.

FIG. 2 shows a nonvolatile semiconductor memory device as a comparative example.

This device is characterized in that first assist gate transistor AGT1 is only formed in first fin type stacked layer structure Fin1, second assist gate transistor AGT2 is only formed in second fin type stacked layer structure Fin2, and third assist gate transistor AGT3 is only formed in third fin type stacked layer structure Fin3.

That is, the end of first assist gate electrode AG1 in the third direction does not reach a first surface of third fin type stacked layer structure Fin3 in the third direction. The end of second assist gate electrode AG2 in the third direction does not reach a second surface of third fin type stacked layer structure Fin3 in the third direction.

Similarly, the end of third assist gate electrode AG3 in the third direction does not reach a second surface of first fin type stacked layer structure Fin1 in the third direction and does not reach a first surface of second fin type stacked layer structure Fin2 in the third direction either.

In this case, in patterning first to third assist gate electrodes AG1, AG2, and AG3, it is necessary to remove a conductive material located in extremely small space X between first and second assist gate electrodes AG1 and AG2 and third fin type stacked layer structure Fin3. It is also necessary to remove a conductive material located in extremely small space X between third assist gate electrode AG3 and first and second fin type stacked layer structures Fin1 and Fin2.

If the space between first to third fin type stacked layer structures Fin1, Fin2, and Fin3 in the third direction is reduced for higher integration, the residue of the conductive material is left in extremely small space X. This residue decreases the reliability of the nonvolatile semiconductor memory device, for example, wrong selection caused by faulty dividing of the assist gate electrodes. That is, it is difficult to achieve higher integration by the structure shown in the comparative example.

Thus, the basic structure shown in FIG. 1 is only different from the comparative example shown in FIG. 2 in the layout of first to third assist gate transistors AGT1, AGT2, and AGT3. This, however, provides an obvious effect of ensuring high reliability so that no residue is left during the patterning of first to third assist gate transistors AGT1, AGT2, and AGT3 even if the space between first to third fin type stacked layer structures Fin1, Fin2, and Fin3 in the third direction is reduced for higher integration.

2. Embodiment (1) Structure

Figure 3:
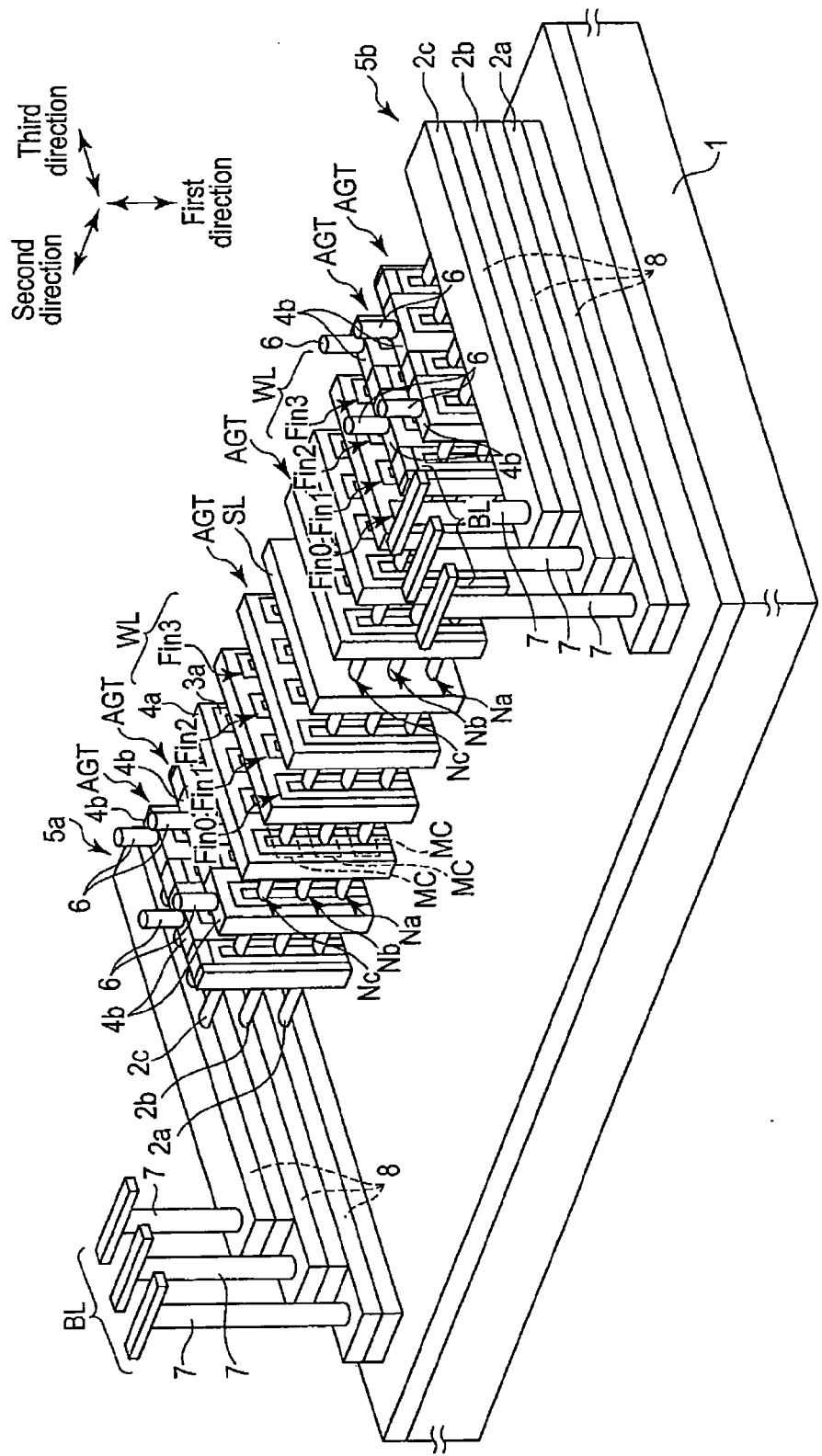
FIG. 3 is a perspective view showing an embodiment.
Figure 5:
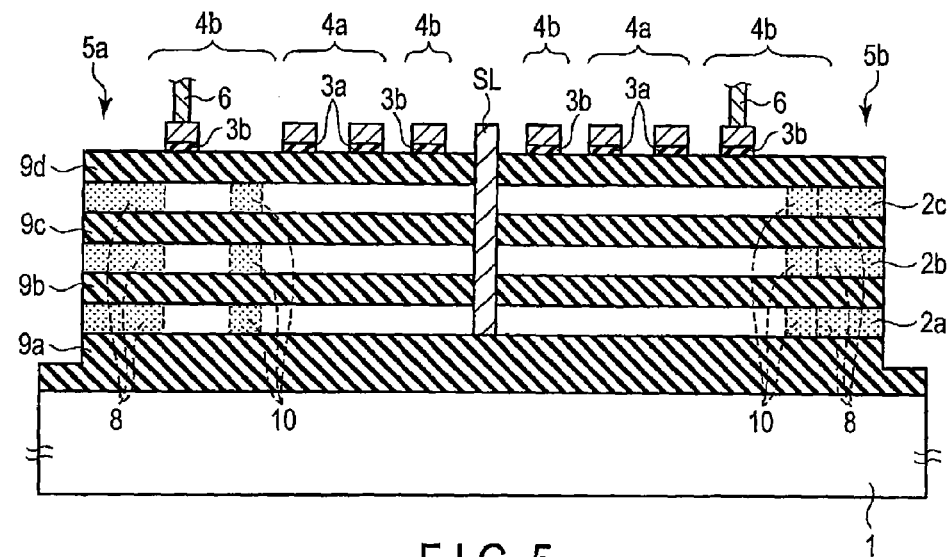
FIG. 5 is a sectional view taken along the line V-V of FIG. 4.
Figure 6:
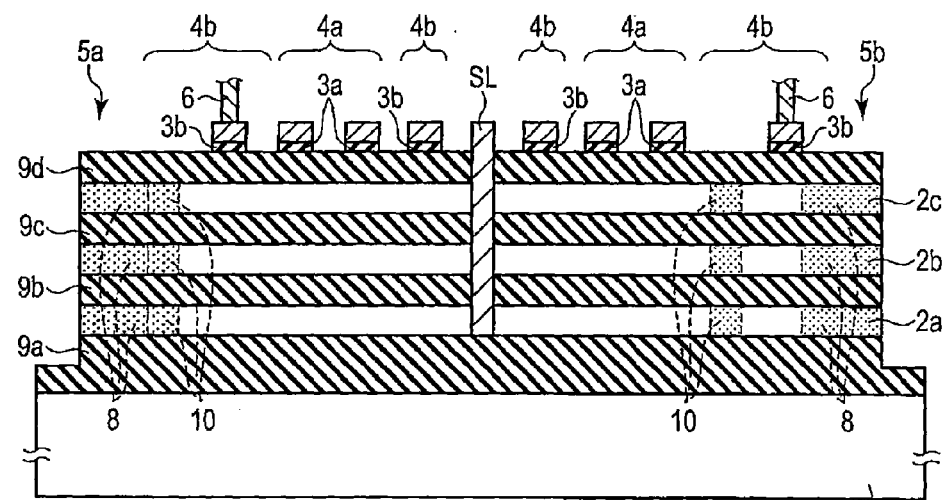
FIG. 6 is a sectional view taken along the line VI-VI of FIG. 4.
Figure 9:
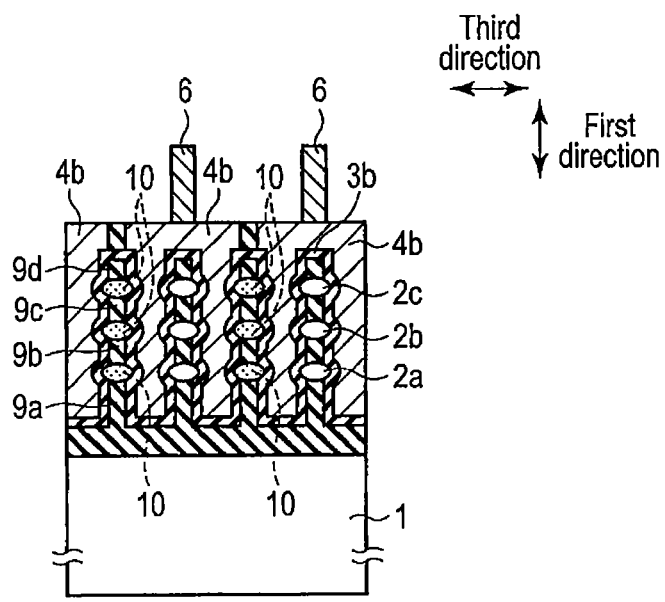
FIG. 9 is a sectional view taken along the line IX-IX of FIG. 4.

FIG. 3 is a perspective view of the nonvolatile semiconductor memory device. FIG. 4 is a plan view of the device shown in FIG. 1. FIG. 5 is a sectional view taken along the line V-V of FIG. 4. FIG. 6 is a sectional view taken along the line VI-VI of FIG. 4. FIG. 7 is a sectional view taken along the line VII-VII of FIG. 4. FIG. 8 is a sectional view taken along the line VIII-VIII of FIG. 4. FIG. 9 is a sectional view taken along the line IX-IX of FIG. 4.

On semiconductor substrate (e.g., Si substrate) 1, there are arranged memory strings Na, Nb, and Nc stacked in a first direction perpendicular to the surface of the substrate and extending in a second direction parallel to the surface of semiconductor substrate 1. In the present embodiment, the number of the memory strings stacked in the first direction is three, but the present invention is not limited to this embodiment. That is, the number of the memory strings stacked in the first direction may be two or more.

The larger number of the memory strings stacked in the first direction is more suitable for higher capacity of the nonvolatile semiconductor memory device.

These memory strings Na, Nb, and Nc are constituted of three semiconductor layers (e.g., monocrystalline Si layers) 2a, 2b, and 2c stacked in the first direction, and memory cells MC connected in series in the second direction. In the present embodiment, the number of memory cells MC connected in series is six, but the present invention is not limited to this embodiment. That is, the number of the memory cells connected in series in the second direction may be two or more.

The larger number of the memory cells connected in series in the second direction is more suitable for higher capacity of the nonvolatile semiconductor memory device.

Semiconductor layers 2a, 2b, and 2c are insulated from one another by insulating layers 9a, 9b, 9c, and 9d. That is, first to third fin type stacked layer structures Fin1 to Fin3 are formed by a stack structure comprising semiconductor layers 2a, 2b, and 2c and insulating layers 9a, 9b, 9c, and 9d.

Figure 10:
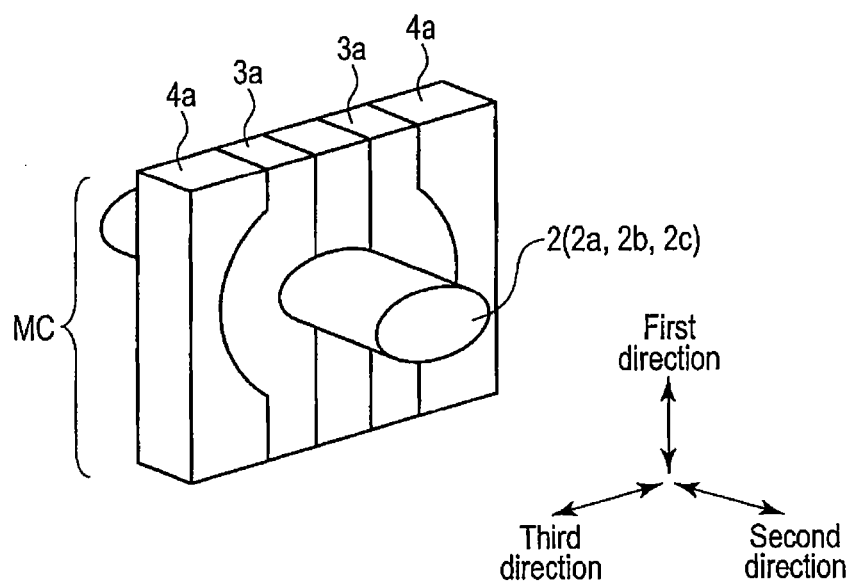
FIG. 10 is a diagram showing a memory cell.

For example, as shown in FIG. 10, each of memory cells MC comprises recording layer 3a disposed on the side surface of semiconductor layer 2 (2a, 2b, or 2c) in a third direction perpendicular to the first and second directions, and gate electrode (e.g., word line WL) 4a disposed on the side of recording layer 3a which is opposite to the side of semiconductor layer 2.

Gate electrode 4a extends in the first direction on the side of the side surface of each of semiconductor layers 2a, 2b, and 2c that is located in the third direction. Moreover, when gate electrode 4a is seen from the upper surface thereof, gate electrode 4a extends across memory strings Na, Nb, and Nc in the third direction.

Beams 5a and 5b extending in the third direction are connected to both ends of each of memory strings Na, Nb, and Nc in the second direction. When semiconductor layers 2a, 2b, and 2c are separated by insulating layers 9a, 9b, 9c, and 9d and one semiconductor layer and one insulating layer are alternately stacked to form fin type stacked layer structures Fin0 to Fin3, for example, beams 5a and 5b have the same structure as fin type stacked layer structures Fin0 to Fin3.

Beams 5a and 5b are common conductive paths of fin type stacked layer structures Fin0 to Fin3.

Beams 5a and 5b have a function of fixing memory strings Na, Nb, and Nc, and preventing, for example, the collapse of fin type stacked layer structures Fin0 to Fin3. The width of each of beams 5a and 5b in the second direction is preferably greater than the width of each of fin type stacked layer structures Fin0 to Fin3 in the third direction, i.e., the width of each of semiconductor layers 2a, 2b, and 2c in the third direction.

Source electrode (common electrode) SL is provided between beams 5a and 5b. Source electrode SL passes through fin type stacked layer structures Fin0 to Fin3, and common source electrode SL is connected to semiconductor layers 2a, 2b, and 2c in fin type stacked layer structures Fin0 to Fin3. In this case, beams 5a and 5b constitute a drain electrode.

Memory strings Na, Nb, and Nc are formed between beam (drain electrode) 5a and source electrode SL and between beam (drain electrode) 5b and source electrode SL.

Between each of memory strings Na, Nb, and Nc and beam 5a, for example, assist gate transistor AGT is disposed to select one fin type stacked layer structure (one group comprising memory strings Na, Nb, and Nc).

Similarly, between each of memory strings Na, Nb, and Nc and beam 5b, for example, assist gate transistor AGT is disposed to select one fin type stacked layer structure (one group comprising memory strings Na, Nb, and Nc).

In the present embodiment, assist gate transistor AGT is also disposed between each of memory strings Na, Nb, and Nc and source electrode SL. Assist gate transistor AGT determines whether to select, for source line SL, memory strings Na, Nb, and Nc on the side of beam 5a or memory strings Na, Nb, and Nc on the side of beam 5b.

However, when one of all shown fin type stacked layer structures Fin0 to Fin3 can be selected by assist gate transistors AGT between memory strings Na, Nb, and Nc and beams 5a and 5b, assist gate transistor AGT between each of memory strings Na, Nb, and Nc and source electrode SL can be omitted.

Assist gate transistors AGT have only to function as switches. Therefore, assist gate transistors AGT may have the same structure as memory cells MC, or may have a different structure.

In the present embodiment, assist gate transistor AGT has recording layer 3b and gate electrode (assist gate electrode) 4b, similarly to each memory cell MC. When assist gate transistors AGT are different in structure from memory cells MC, assist gate transistors AGT can be constituted of, for example, transistors having a metal-oxide-semiconductor (MOS) structure.

Gate electrodes 4b of assist gate transistors AGT on the sides of beams 5a and 5b are independently provided for fin type stacked layer structures Fin0 to Fin3. Gate electrodes 4b are connected to assist gate lines AGL via contact plugs 6.

In contrast, common gate electrode 4b of assist gate transistor AGT on the side of source electrode SL is provided for fin type stacked layer structures Fin0 to Fin3.

Gate electrodes 4b of assist gate transistors AGT on the sides of beams 5a and 5b are arranged zigzag in the third direction.

For example, gate electrodes 4b located on the first-direction surfaces of even-numbered fin type stacked layer structures Fin0, Fin2, . . . arranged in the third direction are divided from one another on the first-direction surfaces of odd-numbered fin type stacked layer structures Fin1, Fin3, . . . .

Gate electrodes 4b located on the first-direction surfaces of odd-numbered fin type stacked layer structures Fin1, Fin3, . . . arranged in the third direction are divided from one another on the first-direction surfaces of even-numbered fin type stacked layer structures Fin0, Fin2, . . . .

For example, assist gate transistor AGT constituted by gate electrode 4b of even-numbered fin type stacked layer structure Fin2 is formed as a double gate type in fin type stacked layer structure Fin2, and is also formed as a single gate type in two odd-numbered fin type stacked layer structures Fin1 and Fin3 adjacent to fin type stacked layer structure Fin2.

For example, assist gate transistor AGT constituted by gate electrode 4b of odd-numbered fin type stacked layer structure Fin1 is formed as a double gate type in fin type stacked layer structure Fin1, and is also formed as a single gate type in two even-numbered fin type stacked layer structures Fin0 and Fin2 adjacent to fin type stacked layer structure Fin1.

At the ends of beams 5a and 5b in the third direction, there is added a function of selecting one of memory strings Na, Nb, and Nc. For example, the ends of beams 5a and 5b in the third direction have a stepped shape, and contact plug 7 is independently connected to each of semiconductor layers 2a, 2b, and 2c (the semiconductor layers in fin type stacked layer structures Fin0 to Fin3) in beams 5a and 5b.

Each of semiconductor layers 2a, 2b, and 2c in beams 5a and 5b is connected to bit line BL via contact plug 7.

In consequence, one of memory strings Na, Nb, and Nc (one of the semiconductor layers in fin type stacked layer structures Fin0 to Fin3) can be selected. That is, the respective semiconductor layers in fin type stacked layer structures Fin0 to Fin3 can independently be controlled as the channels of the memory strings.

In the present embodiment, fin type stacked layer structures Fin0 to Fin3 are arranged in the third direction. In the present embodiment, the number of fin type stacked layer structures Fin0 to Fin3 arranged in the third direction is four, but the present invention is not limited to this embodiment. That is, the number of fin type stacked layer structures Fin0 to Fin3 arranged in the third direction may be two or more.

It is to be noted that the larger number of fin type stacked layer structures Fin0 to Fin3 arranged in the third direction is suitable for higher capacity of the nonvolatile semiconductor memory device.

Moreover, in the present embodiment, single gate type assist gate transistor AGT formed in even-numbered fin type stacked layer structure is normally on, and single gate type assist gate transistor AGT formed in odd-numbered fin type stacked layer structure is normally on. To this end, normally-on channels which are not dependent on the potential of gate electrode 4b are formed in semiconductor layers 2a, 2b, and 2c within fin type stacked layer structures Fin0 to Fin3.

The normally-on channels are obtained, for example, by forming impurity regions 10 in semiconductor layers 2a, 2b, and 2c within fin type stacked layer structures Fin0 to Fin3. Beams 5a and 5b have impurity regions 8 for resistance reduction. Therefore, process modifications of impurity regions 10 can be made; for example, impurity regions 10 are formed simultaneously with impurity regions 8. Structural modifications of impurity regions 10 can also be made; for example, impurity regions 10 are combined with impurity regions 8.

(2) Materials

Now, examples of materials that constitute components of the above-mentioned nonvolatile semiconductor memory device are described.

While materials best suited to the generations of the semiconductor memories can be properly selected as the materials that constitute the elements of the above-mentioned nonvolatile semiconductor memory device, examples of most often used materials are described below.

The semiconductor layers that constitute the fin type stacked layer structure and the beam are made of, for example, silicon (Si), and the insulating layer is made of, for example, silicon oxide ($SiO_2$). The semiconductor layers are preferably monocrystalline, but may be amorphous or polycrystalline. The uppermost insulating layers that constitute the fin type stacked layer structure and the beam comprise, for example, silicon oxide ($SiO_2$), silicon nitride ($SiN_x$), or a structure in which these materials are stacked.

The recording layer that constitutes memory cell MC is, for example, a charge storage layer (a floating gate electrode, a charge trap insulating layer, or the like), or a variable resistance layer (a material layer whose resistance value changes in accordance with a voltage, a current, heat, a magnetic field, or the like).

When the recording layer that constitutes memory cell MC is a charge storage layer, memory cell MC comprises a first gate insulating layer (tunnel insulating layer), a charge storage layer, a second gate insulating layer (block insulating layer), and a control gate electrode. In this case, the control gate electrodes need to be separated from each other in one memory string within one fin type stacked layer structure.

When the charge storage layer is a charge trap insulating layer, the first gate insulating layer, the charge storage layer, and the second gate insulating layer may be or may not be separated from one another in one memory string within one fin type stacked layer structure.

The first gate insulating layer is made of, for example, silicon oxide ($SiO_2$). The charge storage layer is made of, for example, silicon nitride ($Si_3N_4$). The second gate insulating layer is made of, for example, aluminum oxide ($Al_2O_3$). The control gate electrode is made of, for example, nickel silicide (NiSi). The first gate insulating layer may be, for example, a stack structure constituted of silicon oxynitride, silicon oxide, and silicon nitride. Moreover, the first gate insulating layer may include silicon nanoparticles, metal ions, or the like.

For example, the charge storage layer is made of at least one of the materials selected from the group consisting of silicon-rich SiN, $Si_xN_y$ having any composition ratio x, y of silicon and nitrogen, silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), and lanthanum aluminate ($LaAlO_3$).

The charge storage layer may include silicon nanoparticles, metal ions, or the like. The charge storage layer may otherwise be made of impurity-added polysilicon or a conductor such as a metal.

The second gate insulating layer is made of at least one of the materials selected from the group consisting of silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), lanthanum aluminate ($LaAlO_3$), and lanthanum aluminum silicate (LaAlSiO).

The control gate electrode is made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

As an impurity that constitutes the normally-on channels and as an impurity for reducing the resistance of the beam, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

The contact plug, the bit line, the assist gate line, and the source line are made of a metal material such as W, Al, or Cu. These components may be made of the same material or different materials. The bit line and the assist gate line can be formed in the same wiring layer, and are therefore preferably made of the same material.

(3) Fin Type Stacked Layer Structure Selecting Method

FIG. 11 shows an example of a method of selecting a fin type stacked layer structure.

When the layout of assist gate transistors AGT according to the embodiment is used, fin type stacked layer structures Fin0 to Fin3 can be selected by two rows of assist gate electrodes 4b arranged zigzag in the third direction.

For example, the selection of fin type stacked layer structure Fin1 is described.

In this case, an on-potential is applied to assist gate electrode 4b located on the first-direction surface of selected fin type stacked layer structure Fin1 (O mark). At the same time, double gate type assist gate transistor AGT formed in fin type stacked layer structure Fin1 is switched on. Single gate type assist gate transistors AGT formed in two fin type stacked layer structures Fin0 and Fin2 adjacent to fin type stacked layer structure Fin1 are also switched on.

However, an off-potential is applied to assist gate electrodes 4b located on the first-direction surfaces of unselected fin type stacked layer structures Fin0, Fin2, and Fin3 other than selected fin type stacked layer structure Fin1 (X mark). Accordingly, double gate type assist gate transistors AGT formed in fin type stacked layer structures Fin0, Fin2, and Fin3 are switched off.

Thus, no conductive paths (current paths) are formed in the semiconductor layers within unselected fin type stacked layer structures Fin0, Fin2, and Fin3.

On the other hand, as the off-potential is applied to assist gate electrodes 4b located on the first-direction surfaces of unselected fin type stacked layer structures Fin0, Fin2, and Fin3, it is considered that single gate type assist gate transistor AGT formed in fin type stacked layer structure Fin1 is also switched on.

However, as single gate type assist gate transistor AGT in selected fin type stacked layer structure Fin1 is in a normally-on condition in which an impurity is implanted in the channel, a conductive path (current path) is formed in each semiconductor layer within selected fin type stacked layer structure Fin1 accordingly.

(4) Manufacturing Method

Now, a method of manufacturing the nonvolatile semiconductor memory device according to the first embodiment is described.

Figure 12:
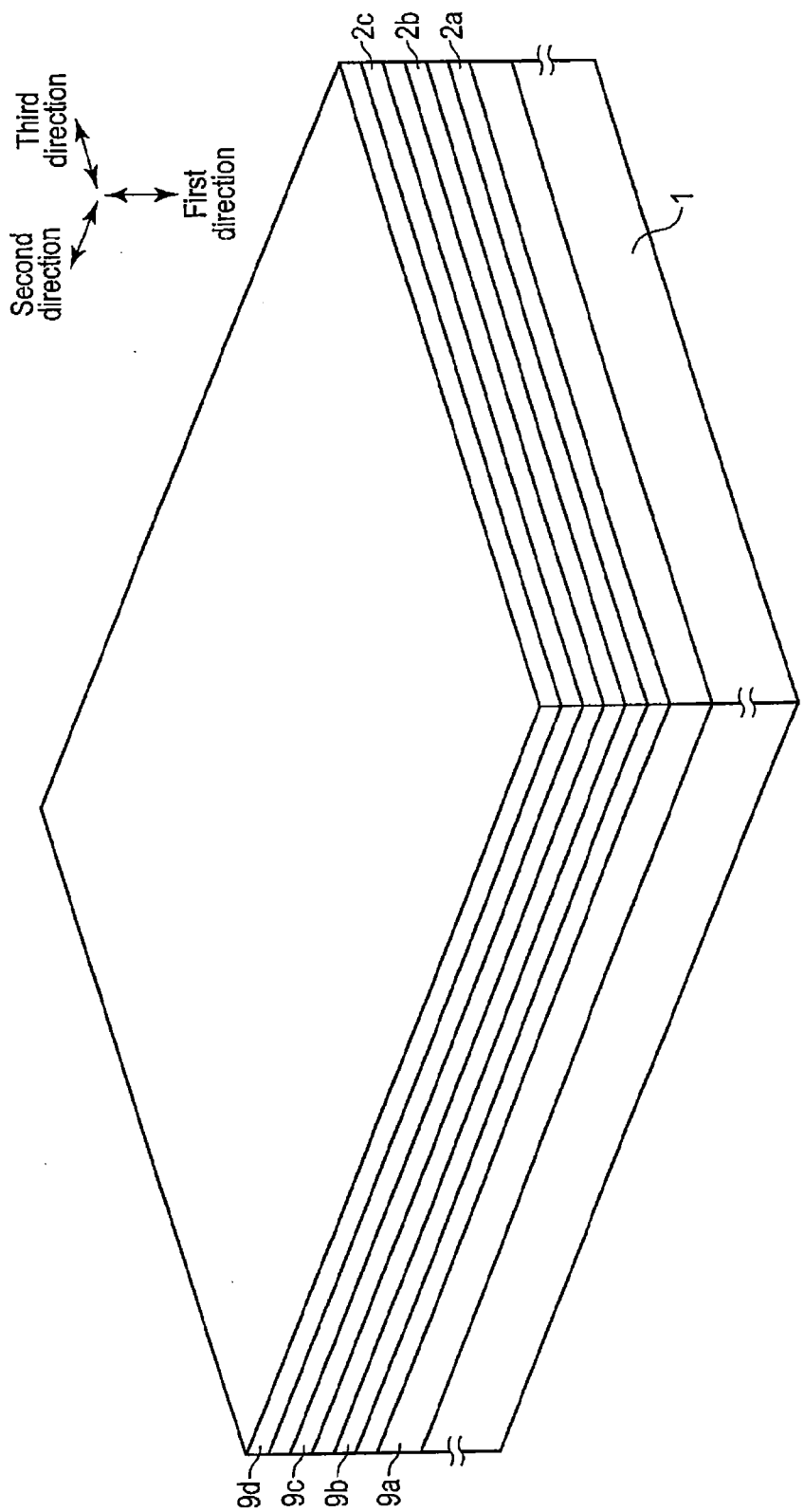

First, as shown in FIG. 12, first-conductivity-type (e.g., p-type) semiconductor substrate (e.g., silicon substrate) 1 having, for example, a plane direction (100) and a specific resistance of 10 to 20 Ωcm is prepared. On this semiconductor substrate 1, a stack structure comprising insulating layers (e.g., silicon oxide) 9a, 9b, 9c, and 9d and semiconductor layers (e.g., monocrystalline silicon) 2a, 2b, and 2c are formed.

That is, insulating layer 9a is formed on semiconductor substrate 1, and semiconductor layer 2a is formed on insulating layer 9a. Insulating layer 9b is formed on semiconductor layer 2a, and semiconductor layer 2b is formed on insulating layer 9b. Insulating layer 9c is formed on semiconductor layer 2b, and semiconductor layer 2c is formed on insulating layer 9c. Insulating layer 9d is formed on semiconductor layer 2c.

Figure 13:
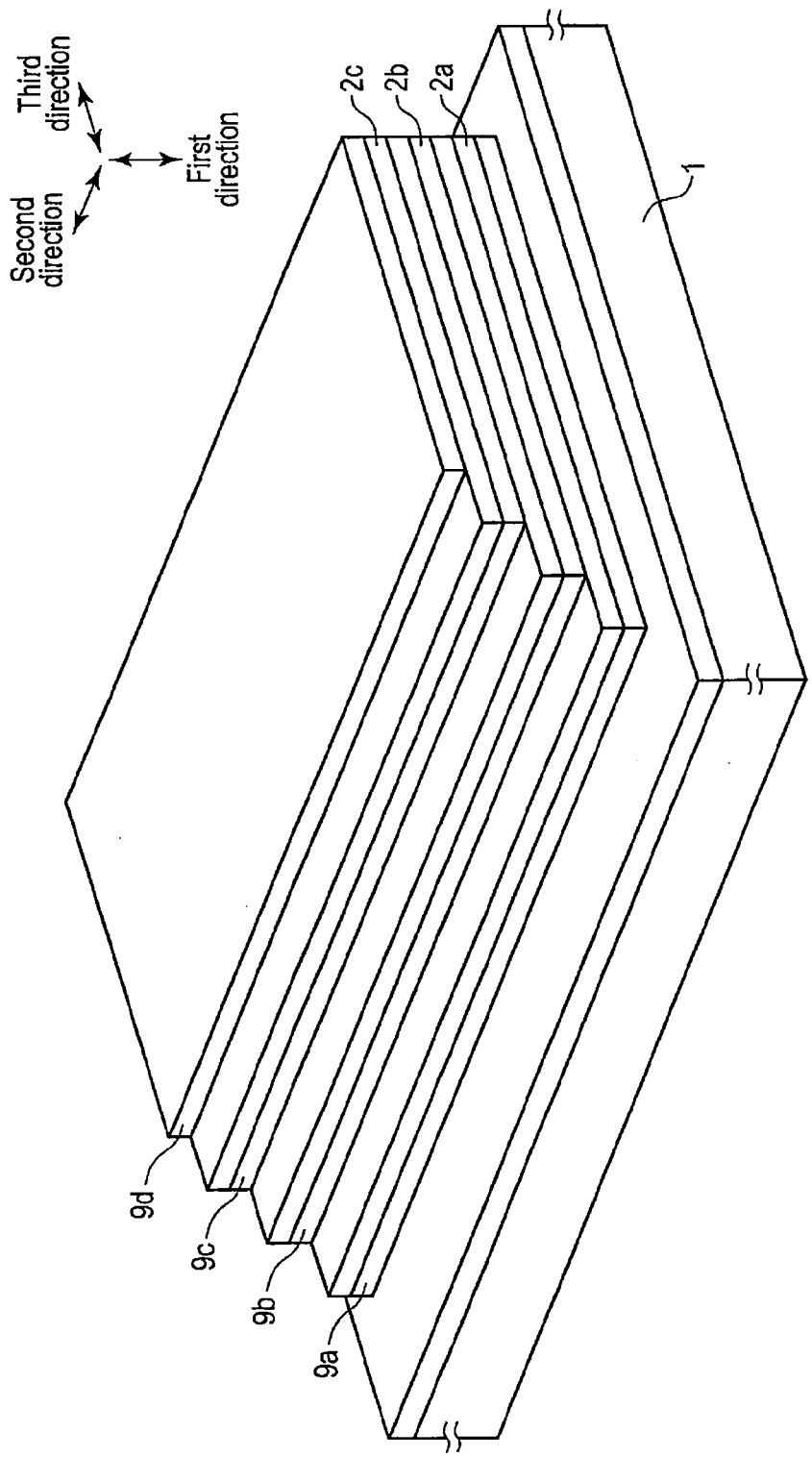

As shown in FIG. 13, a stepped shape that exposes the upper surfaces of semiconductor layers (the lowermost layer, the intermediate layer, and the uppermost layer) 2a, 2b, and 2c are then formed at the end of the stack structure comprising insulating layers 9a, 9b, 9c, and 9d and semiconductor layers 2a, 2b, and 2c in the third direction.

This stepped shape can be formed, for example, by using four photo engraving processes (PEP).

First, a resist pattern is formed on insulating layer 9d by the first PEP. Using this resist pattern as a mask, insulating layer 9d is etched by reactive ion etching (RIE). As a result, an uppermost step is formed. The resist pattern is removed afterwards.

A resist pattern is formed on semiconductor layer 2c and insulating layer 9d by the second PEP. Using this resist pattern as a mask, semiconductor layer 2c and insulating layer 9c are etched by the RIE. As a result, an intermediate step is formed. The resist pattern is removed afterwards.

A resist pattern is formed on semiconductor layers 2b and 2c and insulating layer 9d by the third PEP. Using this resist pattern as a mask, semiconductor layer 2b and insulating layer 9b are etched by the RIE. As a result, a lowermost step is formed. The resist pattern is removed afterwards.

A resist pattern is further formed on semiconductor layers 2a, 2b, and 2c and insulating layer 9d by the fourth PEP. Using this resist pattern as a mask, semiconductor layer 2a and insulating layer 9a are etched by the RIE. The resist pattern is removed afterwards.

According to the process described above, the stepped shape that exposes the upper surfaces of semiconductor layers (the lowermost layer, the intermediate layer, and the uppermost layer) 2a, 2b, and 2c can be formed at the end of the stack structure in the third direction.

As shown in FIG. 14, the stack structure comprising insulating layers 9a, 9b, 9c, and 9d and semiconductor layers 2a, 2b, and 2c is then patterned to form fin type stacked layer structures Fin0, Fin1, Fin2, and Fin3 and beams 5a and 5b which link the fin type stacked layer structures at the end in the second direction.

For example, a resist pattern is formed on semiconductor substrate 1 and semiconductor layers 2a, 2b, and 2c by the PEP, and using this resist pattern as a mask, semiconductor layers 2a, 2b, and 2c and insulating layers 9a, 9b, 9c, and 9d are etched by the RIE. As a result, fin type stacked layer structures Fin0, Fin1, Fin2, and Fin3 extending in the second direction, and beams 5a and 5b which extend in the third direction and which link fin type stacked layer structures Fin0, Fin1, Fin2, and Fin3 at the end in the second direction are formed.

Here, a plan view of the structure shown in FIG. 14 is FIG. 15.

The following process is described with reference to the plan view.

First, as shown in FIG. 16, word line WL (4a) extending across fin type stacked layer structures Fin0, Fin1, Fin2, and Fin3 in the third direction is then formed, and assist gate electrode AG (4b) is formed.

In the case described here, memory cell MC and assist gate transistor AGT have the same structure.

In this case, a gate insulating layer (e.g., silicon oxide) covering the surfaces (side surfaces in the third direction) of semiconductor layers 2a, 2b, and 2c in fin type stacked layer structures Fin0, Fin1, Fin2, and Fin3 is formed, and a recording layer (e.g., a charge storage layer) covering the gate insulating layer is formed. Further, a block insulating layer covering the recording layer is formed, and a conductive layer (gate electrode layer) covering the block insulating layer is formed.

A resist pattern is then formed on the gate electrode layer, for example, by the PEP. Using this resist pattern as a mask, the gate electrode layer, the block insulating layer, the recording layer, and the gate insulating layer are etched by the RIE. As a result, word line WL (4a) and assist gate electrode AG (4b) are formed which extend, in the first direction, on the side surfaces of fin type stacked layer structures Fin0, Fin1, Fin2, and Fin3 in the third direction and which extend in the third direction when seen from the upper surface thereof.

Figure 17:
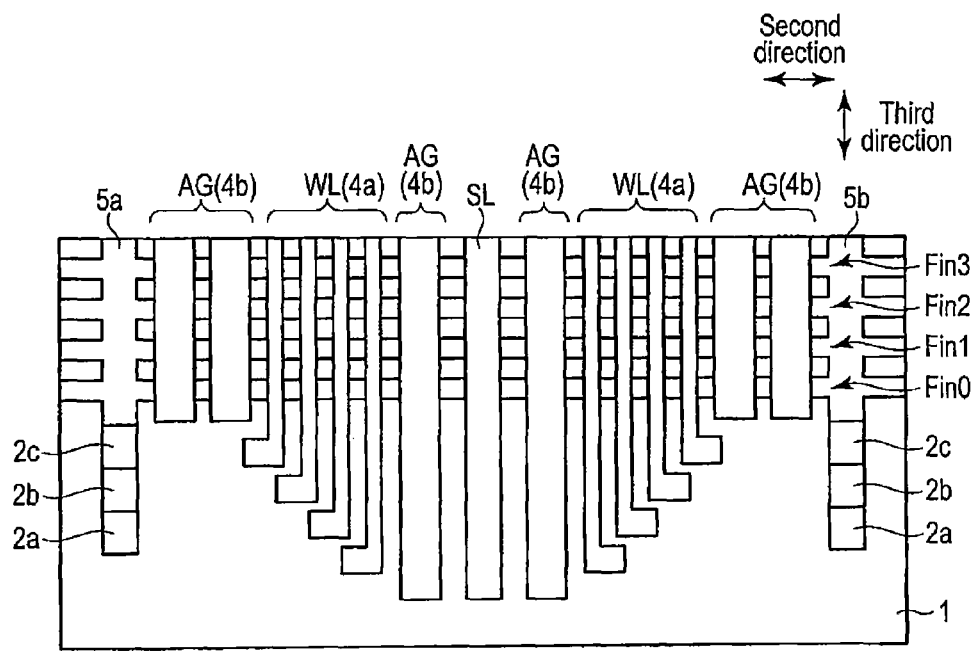

As shown in FIG. 17, a wiring line groove passing through fin type stacked layer structures Fin0, Fin1, Fin2, and Fin3 is then formed by the PEP and the RIE. This wiring line groove is then filled with a conductive material to form source electrode (common electrode) SL electrically connected to the semiconductor layers within fin type stacked layer structures Fin0, Fin1, Fin2, and Fin3.

Figure 18:
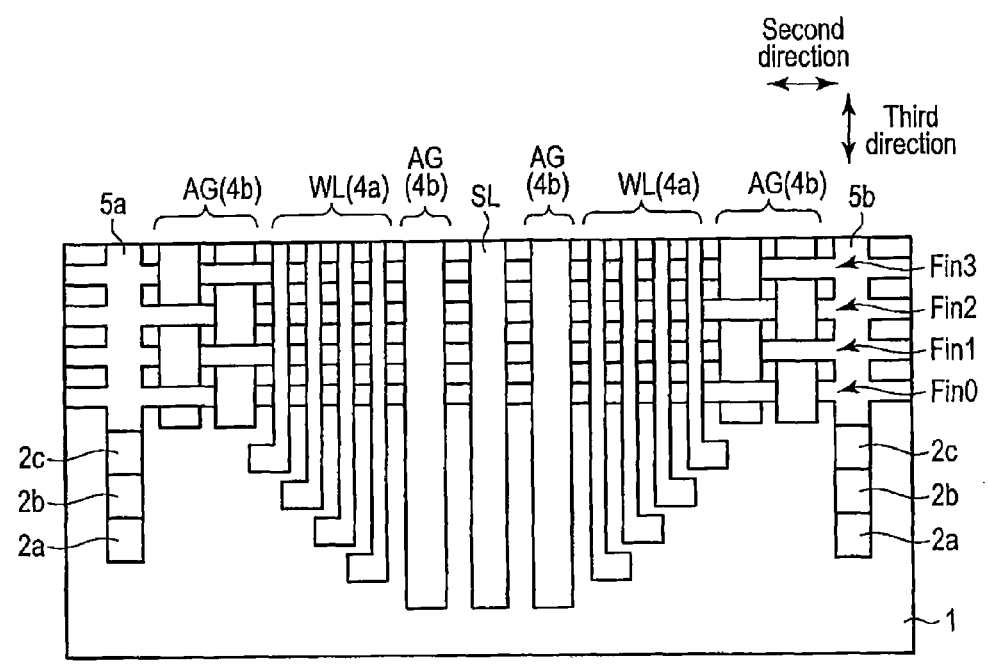

As shown in FIG. 18, assist gate electrodes AG (4b) located on the sides of beams 5a and 5b are then patterned by the PEP and the RIE. As a result, assist gate electrodes AG (4b) located on the sides of beams 5a and 5b are arranged in two rows in the second direction, and are arranged zigzag in the third direction.

In this patterning, the conductive material located on the surfaces of fin type stacked layer structures Fin0, Fin1, Fin2, and Fin3 in the first direction has only to be removed. That is, the difficulty level of the fabrication of assist gate electrodes AG (4b) is low, and no residue is left between fin type stacked layer structures Fin0, Fin1, Fin2, and Fin3.

In the present embodiment, assist gate electrodes AG (4b) located on the sides of beams 5a and 5b are patterned in two separate steps (FIG. 16 and FIG. 18). The reason is that the depth of etching in the patterning in FIG. 16 is different from the depth of etching in the patterning in FIG. 18.

That is, in FIG. 16, the conductive material between fin type stacked layer structures Fin0, Fin1, Fin2, and Fin3 needs to be etched to the bottom surface (the surface of semiconductor substrate 1) of the groove located between fin type stacked layer structures Fin0, Fin1, Fin2, and Fin3. In contrast, in FIG. 18, the conductive material located on fin type stacked layer structures Fin0, Fin1, Fin2, and Fin3 has only to be removed.

However, these patternings may be combined into one patterning. That is, the patterning in FIG. 16 may be conducted simultaneously with the patterning in FIG. 18.

As shown in FIG. 19, impurity ions are implanted to form normally-on channels, thereby forming impurity region 10 in each of the semiconductor layers within fin type stacked layer structures Fin0, Fin1, Fin2, and Fin3.

This impurity region 10 can be formed in a self-aligning manner by covering, with a resist pattern, a region into which ions should not to be implanted, and using this resist pattern and assist gate electrodes AG (4b) located on the sides of beams 5a and 5b as masks.

For example, if the top of word line WL (4a) is covered with the resist pattern, ions are not implanted into a region where memory cell MC is formed.

In the example shown in FIG. 19, the top of word line WL (4a), the top of source electrode SL, the top of assist gate electrode AG (4b) located on the side of source electrode SL, and the tops of beams 5a and 5b are respectively covered by the resist patterns. That is, impurity regions 10 are only formed in parts where normally-on channels should be formed.

However, by this ion implantation, impurity regions for reducing the resistance of beams 5a and 5b or impurity regions for reducing the resistance of the semiconductor layer on the side of source electrode SL may be formed at the same time. If memory cell MC is miniaturized, the fringe effect is generated to allow memory cell MC to function as a memory string without source-drain diffusion layers. It is therefore preferable to implant no ions into memory cell MC.

Figure 20:
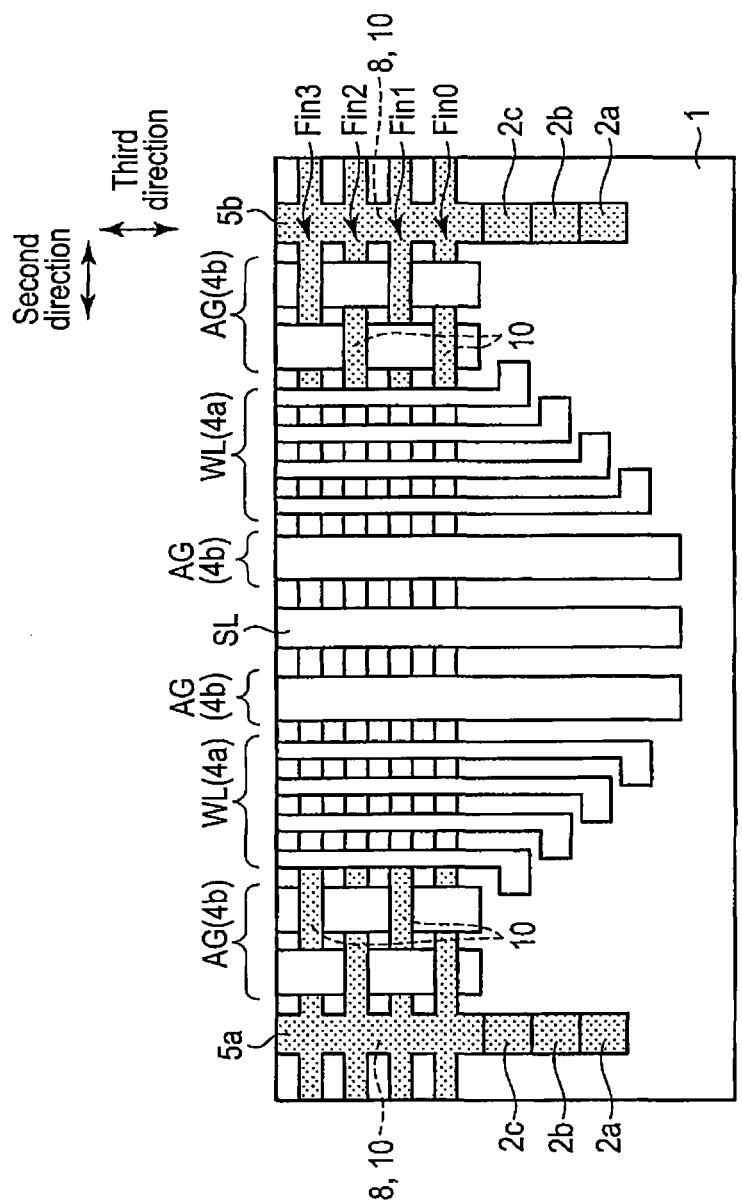

In the example shown in FIG. 20, impurity regions 8 for reducing the resistance of beams 5a and 5b and impurity regions 10 to be normally-on channels are simultaneously formed.

As an impurity used here, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

As shown in FIG. 21, assist gate line contact portion (plug) 6 connected to assist gate electrode AG (4b), and bit line/source line contact portion (plug) 7 independently connected to each of semiconductor layers 2a, 2b, and 2c within first and second beams 5 are then formed.

The device shown in FIG. 3 to FIG. 10 is completed by forming bit lines BL, source lines SL, and assist gate lines AGL.

In the example described above, impurity regions 10 as normally-on channels are formed by ion implantation in a self-aligning manner after the formation of fin type stacked layer structures Fin0, Fin1, Fin2, and Fin3.

However, if the number of (stacked) semiconductor layers that constitute each fin type stacked layer structure increases, it will be difficult to form impurity regions 10 in all the semiconductor layers by ion implantation.

Accordingly, for example, it is possible to implant ions every time one semiconductor layer is formed, and previously form impurity regions 10 as normally-on channels before the formation of fin type stacked layer structures Fin0, Fin1, Fin2, and Fin3.

For example, as shown in FIG. 22, ions are implanted immediately after the formation of semiconductor layers 2a, 2b, and 2c, and impurity regions 10 are previously formed in semiconductor layers 2a, 2b, and 2c.

Figure 23:
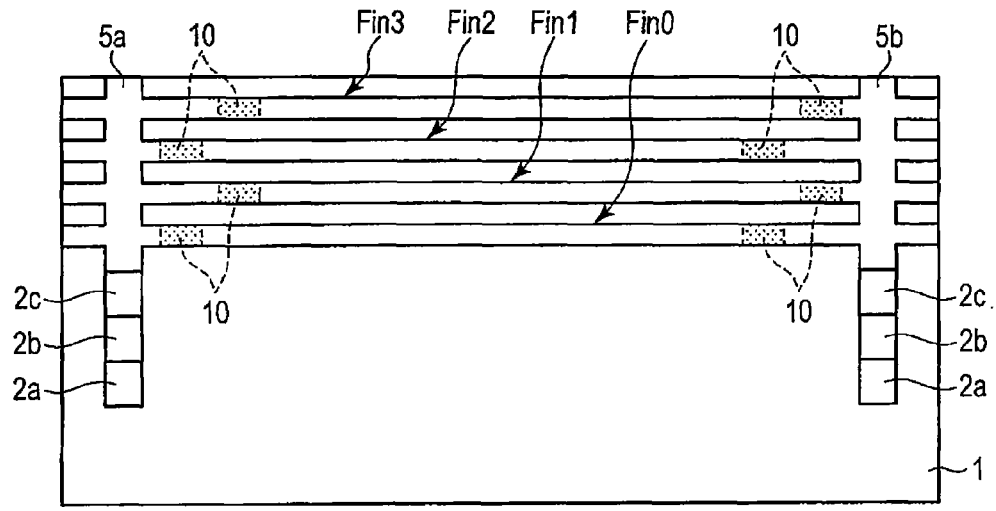

This is followed by the step fabrication shown in FIG. 13 and the patterning shown in FIG. 14. Consequently, for example, as shown in FIG. 23, fin type stacked layer structures Fin0, Fin1, Fin2, and Fin3 having impurity regions 10 as normally-on channels are formed.

(5) Others

In the present embodiment, the normally-on channel is obtained by providing the impurity region in each semiconductor layer. However, it is possible to use a phenomenon in which, for example, the single gate type assist gate transistor formed in each fin type stacked layer structure becomes normally on by what is known as the fringe effect without providing the impurity region.

3. Modifications

Several modifications are described.

Parts different from those in the above embodiment are described below.

(1) First Modification

Figure 24:
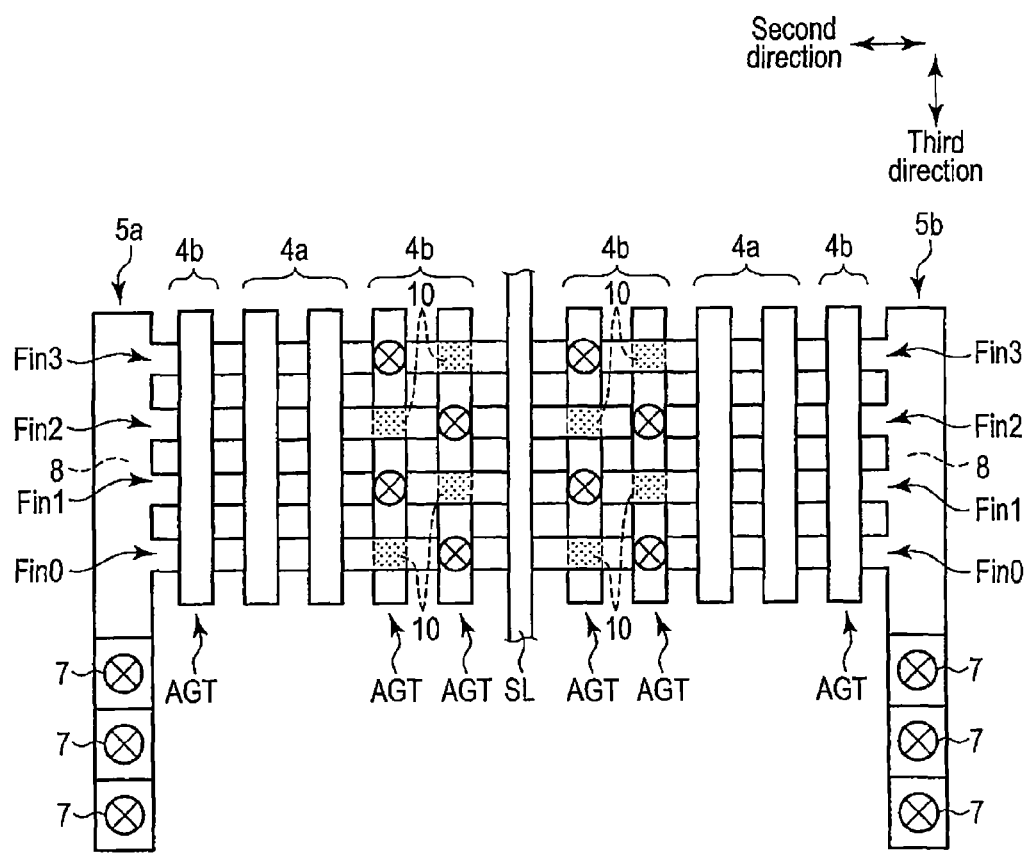
FIG. 24 is a diagram showing a first modification.

FIG. 24 shows a first modification.

As compared with the embodiment described above, this modification is characterized in that assist gate transistors AGT on the sides of beams 5a and 5b (drains) have changed places with assist gate transistors AGT on the side of source electrode SL.

That is, assist gate transistor AGT on the side of source electrode SL comprises assist gate electrodes AG (4b) which are arranged in two rows in the second direction and which are arranged zigzag in the third direction. Assist gate transistor AGT on the side of each of beams 5a and 5b (drains) comprises assist gate electrode AG (4b) shared by fin type stacked layer structures Fin0 to Fin3.

Such a structure also allows one of the fin type stacked layer structures to be selected by the fin type stacked layer structure selecting method similar to that according to the embodiment.

(2) Second Modification

Figure 25:
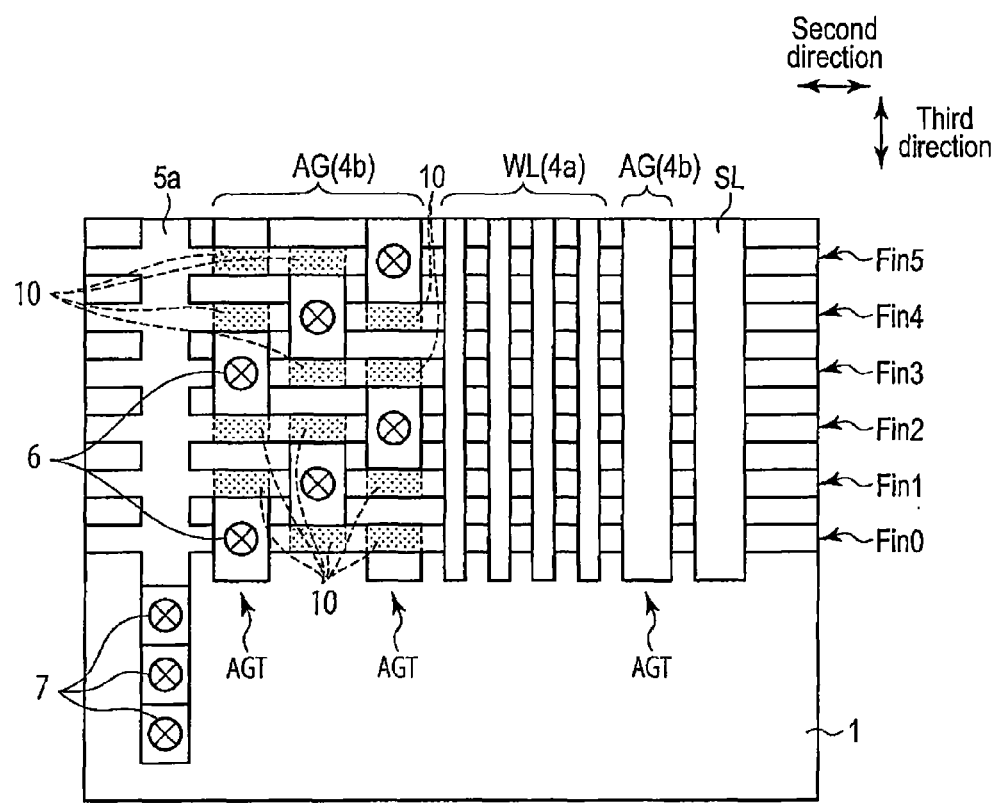
FIG. 25 is a diagram showing a second modification.

FIG. 25 shows a second modification.

This modification is different from the embodiment described above in the layout of assist gate transistors AGT on the sides of beams 5a and 5b (drains).

That is, according to the embodiment described above, assist gate transistor AGT on the side of each of beams 5a and 5b comprises assist gate electrodes AG (4b) which are arranged in two rows in the second direction and which are arranged zigzag in the third direction. In contrast, according to this modification, assist gate transistor AGT on the side of each of beams 5a and 5b comprises assist gate electrodes AG (4b) which are arranged in three rows in the second direction and which are arranged zigzag in the third direction.

Thus, even if the number of rows of assist gate electrodes AG (4b) are increased, one of fin type stacked layer structures can be selected by the fin type stacked layer structure selecting method similar to that according to the embodiment.

However, when the normally-on channels and the fringe effect are used, the fin type stacked layer structure can be selected by at least two rows of assist gate electrodes AG (4b). Therefore, from the viewpoint of higher integration, two rows of assist gate electrodes AG (4b) are preferable as shown in the embodiment.

(3) Third Modification

Figure 26:
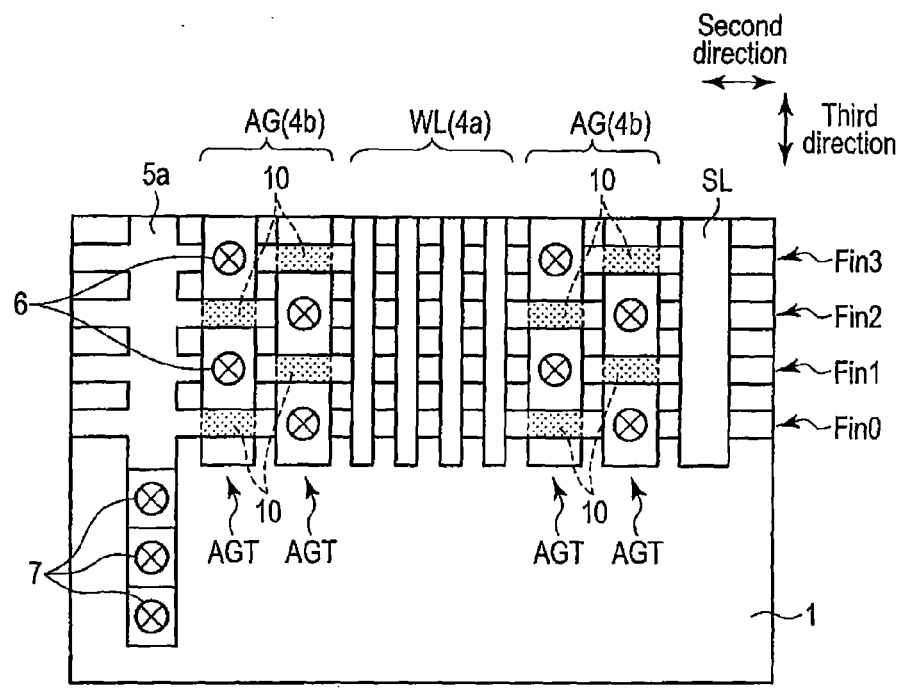
FIG. 26 is a diagram showing a third modification.

FIG. 26 shows a third modification.

As compared with the embodiment described above, this modification is characterized in that the layout of assist gate transistors AGT on the sides of beams 5a and 5b (drains) is the same as the layout of assist gate transistors AGT on the side of source electrode SL.

That is, assist gate transistor AGT on the side of each of beams 5a and 5b comprises assist gate electrodes AG (4b) which are arranged in two rows in the second direction and which are arranged zigzag in the third direction. Similarly, assist gate transistor AGT on the side of source electrode SL comprises assist gate electrodes AG (4b) which are arranged in two rows in the second direction and which are arranged zigzag in the third direction.

The layout of assist gate electrodes AG (4b) on the side of each of beams 5a and 5b and the layout of assist gate electrodes AG (4b) on the side of source electrode SL do not have to be the same if these assist gate electrodes are arranged in two rows in the second direction.

For example, assist gate electrodes AG (4b) on the side of each of beams 5a and 5b and assist gate electrodes AG (4b) on the side of source electrode SL may be laid out in mirror-symmetry form.

Such a structure also allows one of the fin type stacked layer structures, to be selected by the fin type stacked layer structure selecting method similar to that according to the embodiment.

(4) Fourth Modification

Figure 27:
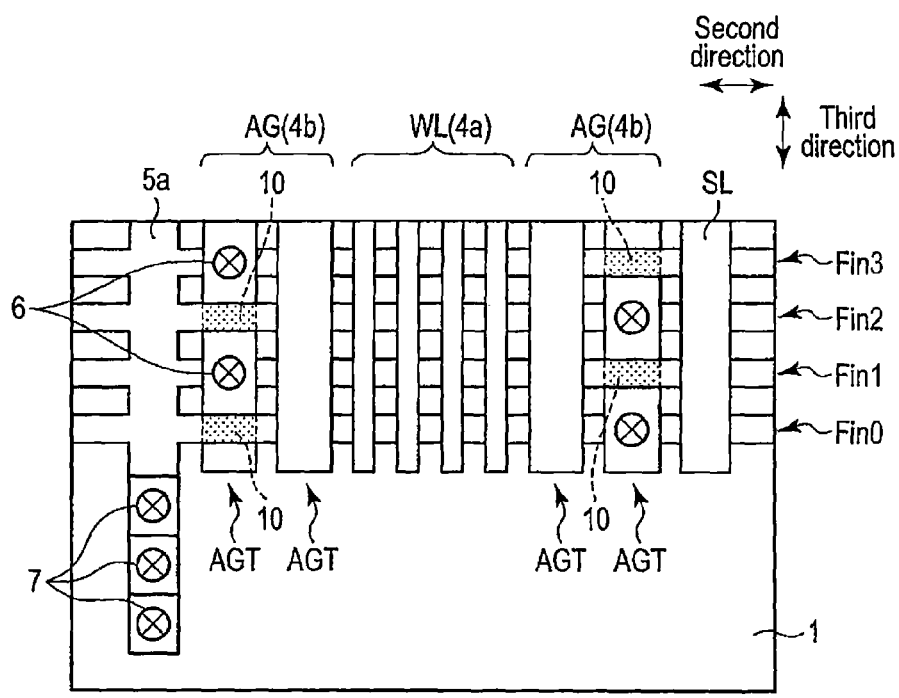
FIG. 27 is a diagram showing a fourth modification.

FIG. 27 shows a fourth modification.

As compared with the embodiment described above, this modification is characterized in that one of the two rows of assist gate electrodes AG (4b) that constitute assist gate transistor AGT for selecting one fin type stacked layer structure is located on the side of each of beams 5a and 5b (drains), and the other row is located on the side of source electrode SL.

One row of assist gate electrode AG (4b) common to fin type stacked layer structures Fin0 to Fin3 is provided on the side of each of beams 5a and 5b (drains), and another row of assist gate electrode AG (4b) common to fin type stacked layer structures Fin0 to Fin3 is also provided on the side of source electrode SL. Accordingly, two rows of assist gate electrodes AG (4b) are located on the sides of beams 5a and 5b, and two rows of assist gate electrodes AG (4b) are also located on the side of source electrode SL.

Such a structure also allows one of the fin type stacked layer structures to be selected by the fin type stacked layer structure selecting method similar to that according to the embodiment.

(5) Fifth Modification

FIG. 28 shows a fifth modification.

This modification is a combination of the third and fourth modifications described above.

That is, assist gate transistor AGT on the side of each of beams 5a and 5b comprises assist gate electrodes AG (4b) which are arranged in two rows in the second direction and which are arranged zigzag in the third direction, and assist gate electrode AG (4b) common to fin type stacked layer structures Fin0 to Fin3. Accordingly, three rows of assist gate electrodes AG (4b) are located on the side of each of beams 5a and 5b.

Similarly, assist gate transistor AGT on the side of source electrode SL comprises assist gate electrodes AG (4b) which are arranged in two rows in the second direction and which are arranged zigzag in the third direction, and assist gate electrode AG (4b) common to fin type stacked layer structures Fin0 to Fin3. Accordingly, three rows of assist gate electrodes AG (4b) are located on the side of each of beams 5a and 5b and the side of source electrode SL.

Such a structure also allows one of the fin type stacked layer structures to be selected by the fin type stacked layer structure selecting method similar to that according to the embodiment.

(6) Sixth Modification

Figure 29:
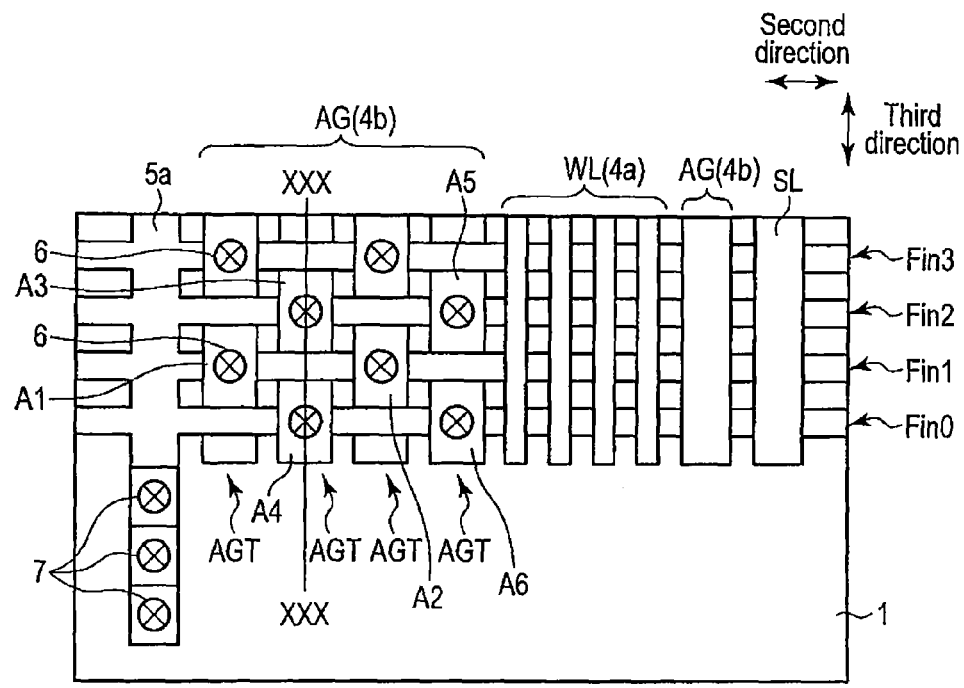
FIG. 29 is a diagram showing a sixth modification.
Figure 30:
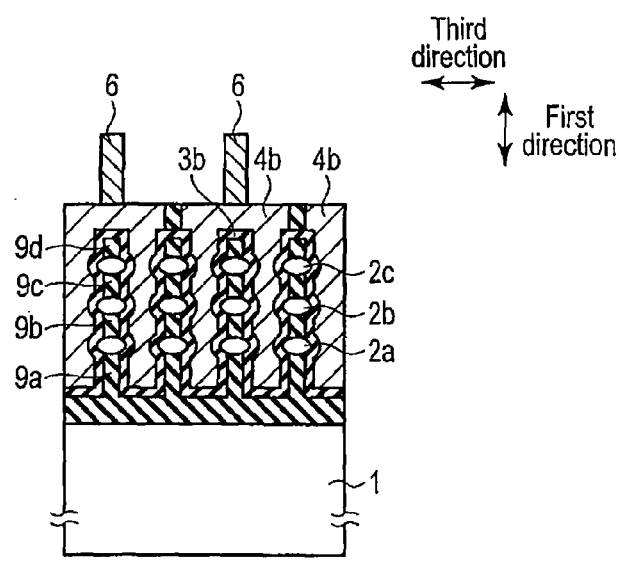
FIG. 30 is a sectional view taken along the line XXX-XXX of FIG. 29.

FIG. 29 and FIG. 30 show a sixth modification. FIG. 30 is a sectional view taken along the line XXX-XXX of FIG. 29.

As compared with the embodiment described above, this modification is characterized in that the normally-on channels (assist gate transistors AGT which are normally on due to the impurity regions or the fringe effect) are not formed in semiconductor layers 2a, 2b, and 2c within fin type stacked layer structures Fin0 to Fin3.

Accordingly, the number of rows of assist gate electrodes AG (4b) for selecting one of fin type stacked layer structures Fin0 to Fin3 is changed to at least four. The configuration is same as that according to the embodiment described above in other respects.

In this case, the on (conducting state)/off (nonconducting state) of the channels of assist gate transistors AGT within semiconductor layers 2a, 2b, and 2c is controlled by both assist gate electrode AG having a double gate structure and assist gate electrode AG having a single gate structure.

For example, the on/off of the channels in semiconductor layers 2a, 2b, and 2c within fin type stacked layer structure Fin1 is controlled by double gate structure assist gate electrodes A1 and A2 that cover two side surfaces of fin type stacked layer structure Fin1 in the third direction and by single gate structure assist gate electrodes A3 to A6 that cover one of the two side surfaces of fin type stacked layer structure Fin1 in the third direction.

Thus, the operation of selecting one of fin type stacked layer structures Fin0 to Fin3 is controlled in the following manner.

For example, in order to select fin type stacked layer structure Fin1, an on-potential (e.g., an "H" level) is applied to double gate structure assist gate electrodes AG (A1 and A2) that cover two side surfaces of fin type stacked layer structure Fin1 in the third direction, as shown in FIG. 31.

An on-potential is also applied to single gate structure assist gate electrodes AG (A3 and A6) that cover one of the two side surfaces of fin type stacked layer structure Fin1 in the third direction.

Moreover, an off-potential (e.g., an "L" level) is applied to single gate structure assist gate electrodes AG (A4 and A5) that cover one of the two side surfaces of fin type stacked layer structure Fin1 in the third direction.

In this case, in selected fin type stacked layer structure Fin1, an on-channel (current path) is formed in each of semiconductor layers 2a, 2b, and 2c by the on-potential applied to assist gate electrodes AG (A1, A2, A3, and A6).

In unselected fin type stacked layer structure Fin0, the current path is blocked by the off-potential applied to assist gate electrode AG (A4), and no current path extending from memory cell MC to beam 5a is formed in each of semiconductor layers 2a, 2b, and 2c.

Similarly, in unselected fin type stacked layer structure Fin2, the current path is blocked by the off-potential applied to assist gate electrode AG (A5), and no current path extending from memory cell MC to beam 5a is formed in each of semiconductor layers 2a, 2b, and 2c.

As described above, one fin type stacked layer structure can be selected by providing at least four rows of assist gate electrodes AG (4b) without providing normally-on channels in semiconductor layers 2a, 2b, and 2c within fin type stacked layer structures Fin0 to Fin3.

According to this modification, for example, the impurity region as the normally-on channel does not need to be formed in each of semiconductor layers 2a, 2b, and 2c within fin type stacked layer structures Fin0 to Fin3. Thus, manufacturing costs can be reduced by the simplification of the manufacturing process. Moreover, according to this modification, there is no need to implant ions into a miniaturized region. It is therefore not necessary to consider a situation where the diffusion of the impurity in the impurity region adversely affects other regions.

However, as four or more rows of assist gate electrodes AG (4b) need to be provided, the area necessary for a memory cell array is larger than that according to the embodiment described above. Thus, the capacity of a semiconductor memory or reliability in manufacturing is taken into account to determine whether to employ the structure according to the embodiment or the structure according to this modification.

(7) Seventh Modification

FIG. 32 shows a seventh modification.

This modification is a further modification of the sixth modification.

This modification is different from the sixth modification in the layout of assist gate transistors AGT on the side of each of beams 5a and 5b (drains) is the same as the layout of assist gate transistors AGT on the side of source electrode SL.

That is, assist gate transistor AGT on the side of each of beams 5a and 5b comprises assist gate electrodes AG (4b) which are arranged in four rows in the second direction and which are arranged zigzag in the third direction. Similarly, assist gate transistor AGT on the side of source electrode SL comprises assist gate electrodes AG (4b) which are arranged in four rows in the second direction and which are arranged zigzag in the third direction.

The layout of assist gate electrodes AG (4b) on the side of each of beams 5a and 5b and the layout of assist gate electrodes AG (4b) on the side of source electrode SL do not have to be the same if these assist gate electrodes are arranged in four rows in the second direction.

For example, assist gate electrodes AG (4b) on the side of each of beams 5a and 5b and assist gate electrodes AG (4b) on the side of source electrode SL may be laid out in mirror-symmetry form.

Such a structure also allows one of the fin type stacked layer structures to be selected by the fin type stacked layer structure selecting method similar to that according to the sixth modification.

(8) Other Modifications

When a flash memory having a charge storage layer is used as a memory cell and when a NAND string comprising memory cells connected in series is used as a memory string, a diffusion layer may be formed or may be not formed between the memory cells.

In the embodiment and modifications described above, the source electrode and the drain electrode can change places with each other. The beam is not indispensable in the embodiment and modifications described above. However, the beam has an advantageous effect of preventing, for example, the collapse of the fin type stacked layer structures, and is therefore preferably provided.

Figure 33:
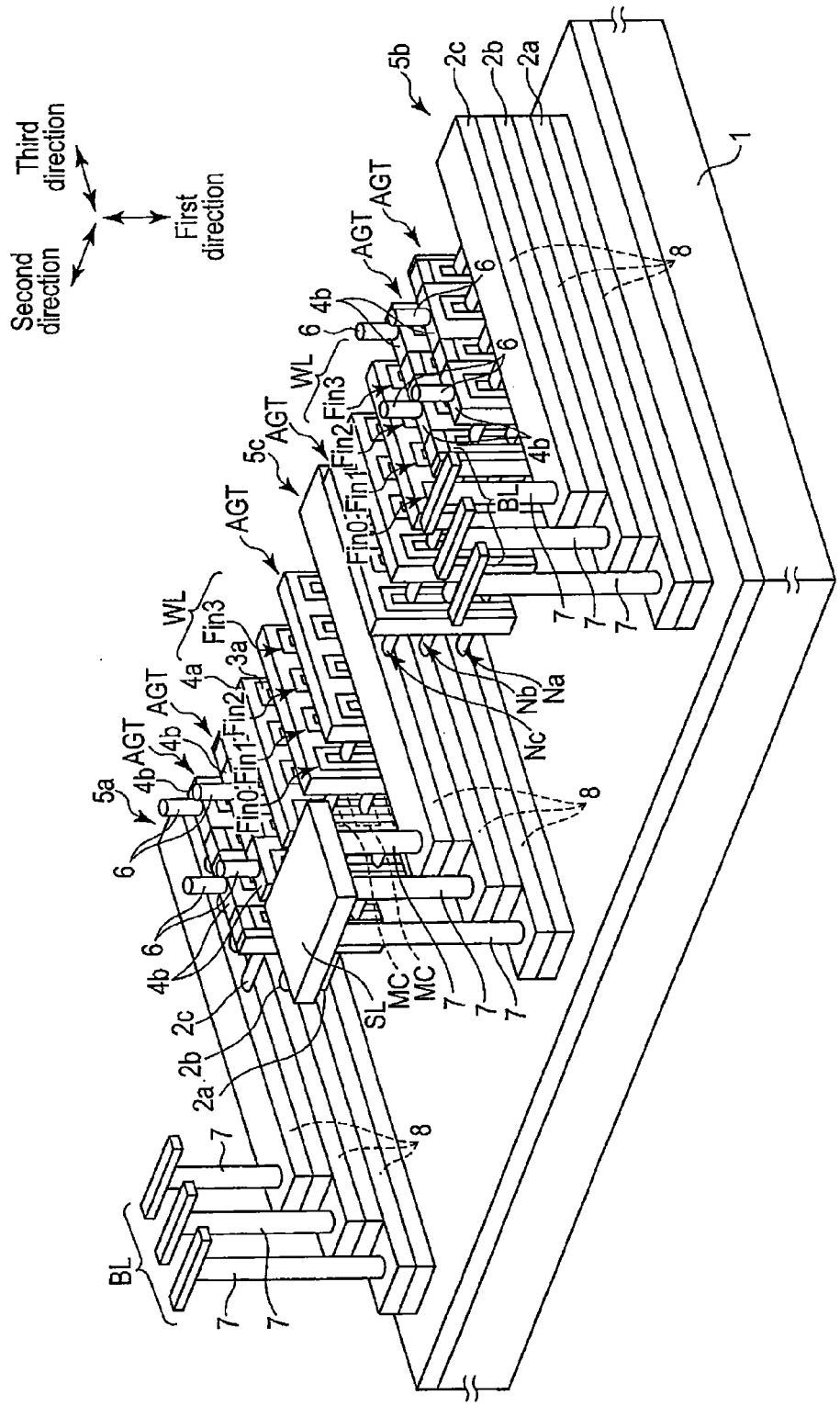

For example, as shown in FIG. 33, both ends of each of memory strings Na, Nb, and Nc in the second direction can be respectively supported by beams 5a, 5b, and 5c. In this case as well, it goes without saying that source line (source electrode) SL and bit line (drain electrode) BL can change places with each other.

As shown in FIG. 34 to FIG. 36, one end of each of memory strings Na, Nb, and Nc in the second direction can be supported by beam 5d, and the other end of each of memory strings Na, Nb, and Nc in the second direction can be connected to electrode (e.g., semiconductor layer) 11.

Here, FIG. 35 is a plan view of a part of FIG. 34. FIG. 36 is a sectional view taken along the line XXXVI-XXXVI of FIG. 35.

In this example, electrode 11 is provided, for example, for each fin type stacked layer structure, and connected to contact plug 12. When electrode 11 comprises a semiconductor layer, the semiconductor layer is preferably reduced in resistance by an impurity region or metal silicide.

Beam 5d may be a drain electrode, and electrode 11 may be a source electrode. Alternatively, beam 5d may be a source electrode, and electrode 11 may be a drain electrode.

As in the embodiment and modifications described above, one end of the beam can have a stepped shape as a means of selecting one semiconductor layer in each fin type stacked layer structure. Alternatively, as described below, a layer select transistor can be used as such a means.

FIG. 37 shows a modification that uses the layer select transistor.

In this modification, one common bit line contact portion (plug) 7 is provided for semiconductor layers 2a, 2b, and 2c within each of beams 5a and 5b. The function of selecting one of memory strings Na, Nb, and Nc, that is, one of semiconductor layers 2a, 2b, and 2c is obtained by layer select transistors LSTa, LSTb, and LSTc.

Layer select transistor LSTa is normally on in lowermost semiconductor layer 2a in each of beams 5a and 5b, i.e., semiconductor layer 2a provided with one memory string Na in each of fin type stacked layer structures Fin0 to Fin3. Layer select transistor LSTa functions as a switch in other semiconductor layers 2b and 2c.

Moreover, layer select transistor LSTb is normally on in intermediate semiconductor layer 2b in each of beams 5a and 5b, i.e., semiconductor layer 2b provided with one memory string Nb in each of fin type stacked layer structures Fin0 to Fin3. Layer select transistor LSTb functions as a switch in other semiconductor layers 2a and 2c.

Furthermore, layer select transistor LSTc is normally on in uppermost semiconductor layer 2c in each of beams 5a and 5b, i.e., semiconductor layer 2c provided with one memory string Nc in each of fin type stacked layer structures Fin0 to Fin3. Layer select transistor LSTc functions as a switch in other semiconductor layers 2a and 2b.

The normally-on state of layer select transistors LSTa, LSTb, and LSTc is obtained, for example, by selectively forming impurity regions 13a, 13b, and 13c in the respective semiconductor layers of beams 5a and 5b.

In this case, for example, when memory string Na is selected, a potential is applied to select gate electrode SG so that layer select transistor LSTa is off and layer select transistors LSTb and LSTc are on. At this time, in the uppermost layer and the intermediate layer, layer select transistor LSTa is off, and hence memory strings Nb and Nc are not selected. In contrast, in the lowermost layer, layer select transistor LSTa is normally on, and hence memory string Na is selected.

According to a similar principle, memory strings Nb and Nc can independently be selected.

The configuration is the same as that of the device shown in FIG. 3 to FIG. 10 except for the parts described above, and is therefore not described here. Examples of materials are also similar to those described in the embodiment.

Additionally, each of layer select transistors LSTa, LSTb, and LSTc may be constituted of recording layer 3 and gate electrode 4b, similarly to memory cell MC. The transistor may be different in structure from memory cell MC instead.

When layer select transistors LSTa, LSTb, and LSTc are different in structure from memory cells MC, layer select transistors LSTa, LSTb, and LSTc can be constituted of, for example, transistors having a MOS structure.

The sign BOX (bottom oxide) denotes an element isolation insulating layer, and the numerals 9a, 9b, and 9c denote insulating layers that insulate semiconductor layers 2a, 2b, and 2c.

According to this structure, one of the memory strings in one fin type stacked layer structure is selected, so that it is not necessary to provide contact portions corresponding to the number of stacked semiconductor layers 2a, 2b, and 2c. For example, while three contact portions (plugs) are provided for three semiconductor layers 2a, 2b, and 2c in the embodiment shown in FIG. 3 to FIG. 10, one common contact portion (plug) has only to be provided for three semiconductor layers 2a, 2b, and 2c in this example.

That is, according to this example, one contact portion has only to be provided for the semiconductor layers regardless of the number of stacked memory strings, so that the area of the contact portion is not increased even if the memory capacity is increased by increasing the number of stacked memory strings. This can contribute to the increase of the memory capacity and the reduction of chip area.

4. Operation

An example of the operation of the nonvolatile semiconductor memory device according to the embodiment is described.

In the following explanation, the targets for writing/reading are memory strings Na, Nb, and Nc in fin type stacked layer structures Fin0 shown in FIG. 3 (embodiment).

Each of memory strings Na, Nb, and Nc is a NAND string comprising memory cells connected in series, and each of the memory cells is an FET (flash memory cell) having a charge storage layer.

An example of write operation is as follows.

First, a ground potential is applied to bit line BL and source line SL, and in this condition, a first positive bias is applied to all word lines WL. At the same time, N-type impurity storage regions are formed in semiconductor layers 2a, 2b, and 2c serving as channels of memory strings Na, Nb, and Nc.

Furthermore, the potential of assist gate line AGL corresponding to selected fin type stacked layer structure Fin0 is set to "H", and double gate structure assist gate transistor AGT in fin type stacked layer structure Fin0 is switched on. The potentials of assist gate lines AGL corresponding to unselected fin type stacked layer structures Fin1, Fin2, and Fin3 are set to "L", and double gate structure assist gate transistors AGT in fin type stacked layer structures Fin1, Fin2, and Fin3 are switched off.

Here, "H" is defined as a potential for switching on the transistor (FET), and "L" is defined as a potential for switching off the transistor (FET). The same applies to the following cases.

Subsequently, for example, a second positive bias higher than the first positive bias is applied to word line (control gate electrode) WL-select of the selected memory cell targeted for writing.

In the present embodiment, data can be written into all memory strings Na, Nb, and Nc in selected fin type stacked layer structure Fin0 in parallel. Thus, program data "0"/"1" is transferred to the channels of memory strings Na, Nb, and Nc in fin type stacked layer structure Fin0 from bit line BL.

At the same time, in memory strings Na, Nb, and Nc in unselected fin type stacked layer structures Fin1, Fin2, and Fin3, the channel potential is increased by capacitive coupling resulting from the application of the second positive bias. Therefore, a voltage high enough for writing is not applied across the control gate electrode (or charge storage layer) and the channel, and writing is inhibited accordingly.

In contrast, in selected fin type stacked layer structure Fin0, double gate structure assist gate transistor AGT is on. Thus, program data "0"/"1" is transferred to the channels of memory strings Na, Nb and Nc.

When the program data is "0", the channel, for example, has a positive potential. In this condition, if the second positive bias is applied to the control gate electrode of the selected memory cell, assist gate transistor AGT on the side of bit line BL is cut off when the channel potential is slightly increased by the capacitive coupling.

Therefore, in the memory string to which the program data "0" is transferred, the channel potential is increased by the capacitive coupling resulting from the application of the second positive bias. That is, a voltage high enough for writing is not applied across the control gate electrode (or charge storage layer) and the channel, and electrons are not injected into the charge storage layer. That is, writing is inhibited ("0"-programming).

In contrast, when the program data is "1", the channel, for example, has a ground potential. In this condition, even if the second positive bias is applied to the control gate electrode of the selected memory cell, assist gate transistor AGT on the side of bit line BL is cut not off.

Therefore, in the memory string to which the program data "1" is transferred, a voltage high enough for writing is generated across the control gate electrode (or charge storage layer) and the channel, and electrons are injected into the charge storage layer. That is, writing is performed ("1"-programming).

An example of erase operation is as follows.

The erase operation can be simultaneously performed in, for example, memory strings Na, Nb, and Nc in selected one or more fin type stacked layer structures.

First, a ground potential is applied to bit line BL and source line SL, and a first negative bias is applied to word line WL. At the same time, P-type impurity storage regions are formed in semiconductor layers 2a, 2b, and 2c serving as channels of memory strings Na, Nb, and Nc.

Furthermore, the potential of assist gate line AGL corresponding to selected one or more fin type stacked layer structures targeted for erasing is set to "H", and assist gate transistor AGT corresponding to selected one or more fin type stacked layer structures is switched on.

A second negative bias higher than the first negative bias is then applied to all word lines WL.

As a result, a voltage high enough for erasing is generated across the control gate electrode (or charge storage layer) and the channel, and electrons in the charge storage layer are discharged to the channel. Thus, erasing is performed.

An example of read operation is as follows.

First, bit line BL is connected to a reading circuit, and a ground voltage is applied to source line SL.

The potential of assist gate line AGL corresponding to selected fin type stacked layer structure Fin0 is then set to "H", and double gate structure assist gate transistor AGT in fin type stacked layer structure Fin0 is switched on. The potentials of assist gate lines AGL corresponding to unselected fin type stacked layer structures Fin1, Fin2, and Fin3 are set to "L", and double gate structure assist gate transistors AGT in fin type stacked layer structures Fin1, Fin2, and Fin3 are switched off.

Subsequently, a first positive bias is applied to word line WL. The first positive bias has a value that switches on the memory cell regardless of whether data is "0" or "1".

Data is then sequentially read in memory strings Na, Nb, and Nc from the memory cells on the side of source line SL to the memory cells on the side of bit line BL.

In the selected memory cell targeted for reading, for example, a second positive bias for reading that is lower than the first positive bias is applied to the control gate electrode. The second positive bias has, for example, a value between the threshold of the "0"-data and the threshold of the "1"-data.

Therefore, whether to switch on or off the selected memory cell is determined by the value of the data stored in the selected memory cell, so that reading can be performed by using the reading circuit to detect potential changes in bit line BL and changes in currents running through bit line BL.

In the present embodiment, data can be read from all memory strings Na, Nb, and Nc in selected fin type stacked layer structure Fin0 in parallel.

5. Cross Point Type Memory Cell Array

In the embodiment described above, the memory cell formed in the fin type stacked layer structure is an EFT (e.g., a flash memory cell having a charge storage layer) which has the recording layer and the gate electrode and which uses the semiconductor layer as a channel. However, the present invention is not limited to this embodiment.

For example, when first and second fin type stacked layer structures intersect with each other and two-terminal type memory cells are arranged between an electrically conductive layer in the first fin type stacked layer structure and an electrically conductive layer in the second fin type stacked layer structure, a cross point type memory cell array can be obtained.

In this case, as the memory cells, it is possible to employ, as they are, memory cells for use in a resistance change type memory such as a resistance random access memory (ReRAM), a phase change memory (PCM), or a magnetic random access memory (MRAM). As the electrically conductive layer, it is possible to employ a semiconductor layer to which the resistance reduction technique according to the embodiment described above is applied, or a metal layer.

Figure 38:
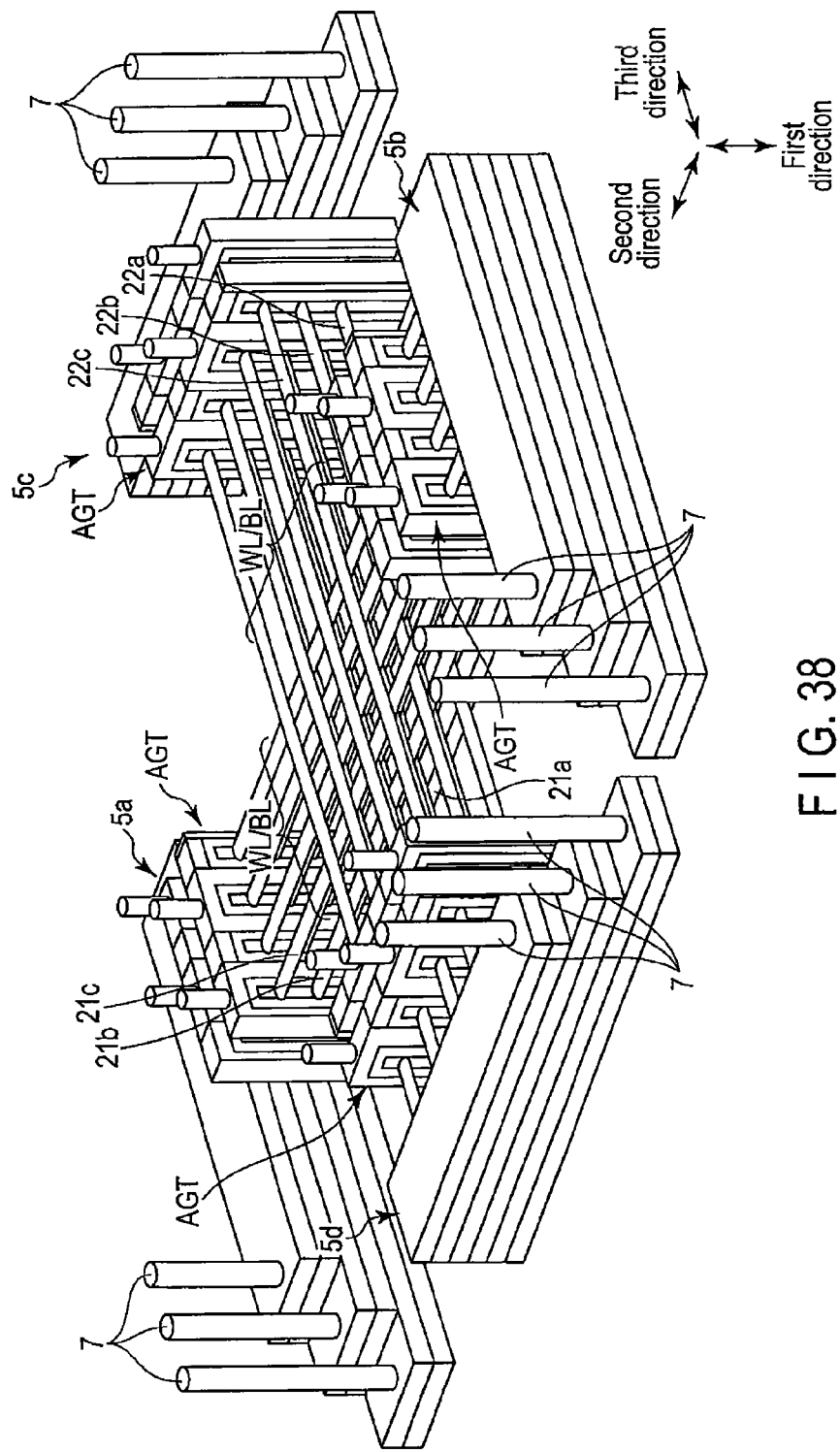
FIG. 38 is a perspective view showing a cross point type memory cell array.
Figure 39:
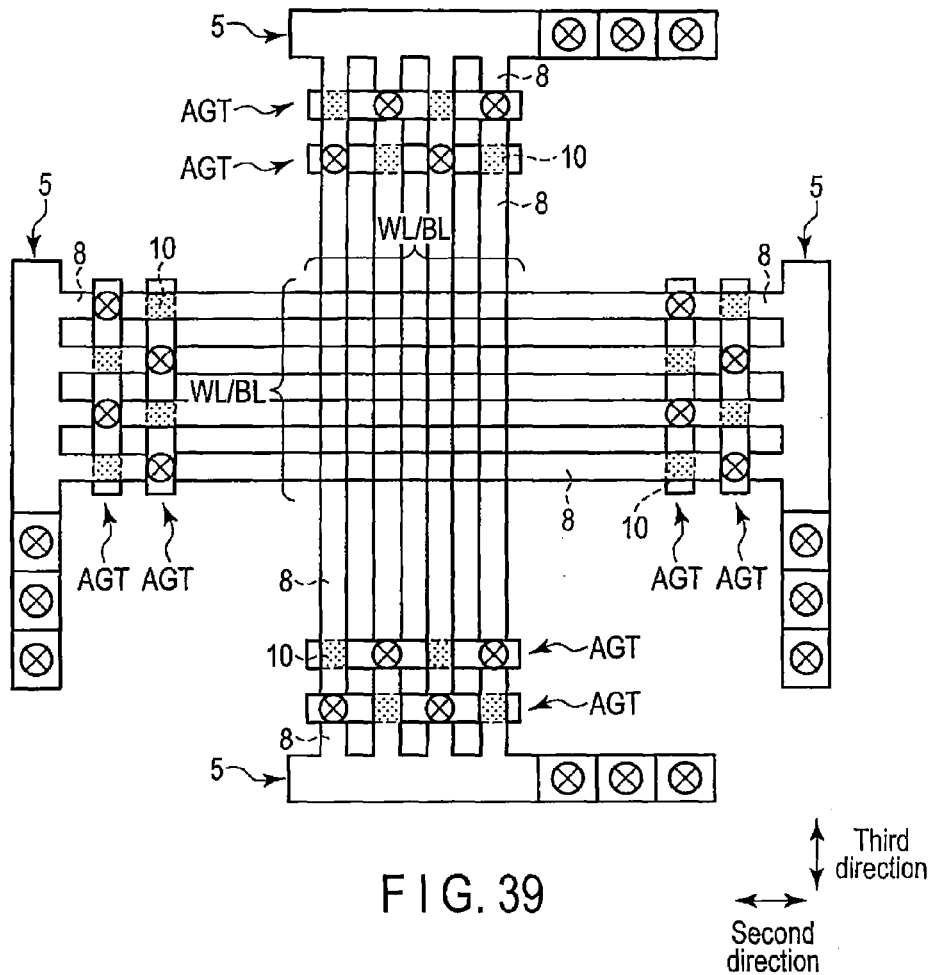
FIG. 39 is a plan view of FIG. 38.

FIG. 38 is a perspective view of a nonvolatile semiconductor memory device which makes it possible to provide a cross point type memory cell array, and FIG. 39 shows a plan view of the device shown in FIG. 38.

On semiconductor substrate (e.g., an Si substrate) 1, a first fin type stacked layer structure and a second fin type stacked layer structure intersecting with each other are arranged.

The first fin type stacked layer structure comprises electrically conductive layers (e.g., semiconductor layers or metal layers) 21a, 21b, and 21c which are stacked in a first direction perpendicular to the surface of semiconductor substrate 1 and which extend in a second direction parallel to the surface of semiconductor substrate 1.

The second fin type stacked layer structure comprises electrically conductive layers (e.g., semiconductor layers or metal layers) 22a, 22b, and 22c which are stacked in the first direction perpendicular to the surface of semiconductor substrate 1 and which extend in a third direction parallel to the surface of semiconductor substrate 1.

In the present embodiment, the number of electrically conductive layers stacked in the first direction is three in both of the first and second fin type stacked layer structures, but the present invention is not limited to this embodiment. That is, the number of the electrically conductive layers stacked in the first direction may be two or more.

It is to be noted that the larger number of electrically conductive layers stacked in the first direction is suitable for higher capacity of the nonvolatile semiconductor memory device.

Electrically conductive layers 21a, 21b, and 21c in the first fin type stacked layer structure function as word lines WL or bit lines BL. Similarly, electrically conductive layers 22a, 22b, and 22c in the second fin type stacked layer structure function as word lines WL or bit lines BL.

Figure 40:
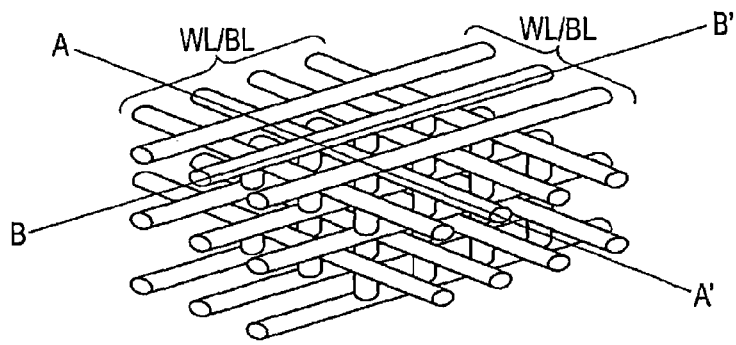
FIG. 40 is a perspective view showing a memory cell array.

For example, as shown in FIG. 40 and FIG. 41, two-terminal type memory cells MC are arranged between electrically conductive layer WL/BL (21a, 21b, or 21c) in the first fin type stacked layer structure and electrically conductive layer WL/BL (22a, 22b, or 22c) in the second fin type stacked layer structure.

As the memory cells, it is possible to employ, as they are, memory cells for use in a resistance change element whose resistance value changes in accordance with a voltage, a current, heat, a magnetic field, or the like, or a resistance change type memory such as a resistance random access memory (ReRAM), a phase change memory (PCM), or a magnetic random access memory (MRAM).

Beams 5a and 5b extending in the third direction are connected to both ends of electrically conductive layer WL/BL (21a, 21b, or 21c) in the first fin type stacked layer structure in the second direction. For example, beams 5a and 5b have the same structure as the first fin type stacked layer structure.

Similarly, beams 5c and 5d extending in the second direction are connected to both ends of electrically conductive layer WL/BL (22a, 22b, or 22c) in the second fin type stacked layer structure in the third direction. For example, beams 5 have the same structure as the second fin type stacked layer structure.

Beams 5a to 5d are provided to fix the first and second fin type stacked layer structures, thereby preventing the collapse of the structures. The width of each of beams 5a and 5b connected to the first fin type stacked layer structure in the second direction is preferably greater than the width of the first fin type stacked layer structure in the third direction, i.e., the width of each of electrically conductive layers WL/BL (21a, 21b, and 21c) in the third direction.

Moreover, the width of each of beams 5c and 5d connected to the second fin type stacked layer structure in the third direction is preferably greater than the width of the second fin type stacked layer structure in the second direction, i.e., the width of each of electrically conductive layers WL/BL (22a, 22b, and 22c) in the second direction.

Between electrically conductive layer WL/BL (21a, 21b, or 21c) in the first fin type stacked layer structure and each of beams 5a and 5b, assist gate transistor AGT is disposed. Also between electrically conductive layer WL/BL (22a, 22b, or 22c) in the second fin type stacked layer structure and each of beams 5c and 5d, assist gate transistor AGT is disposed.

Assist gate transistors AGT have only to function as switches. Assist gate transistors AGT can be constituted of, for example, transistors having a metal-oxide-semiconductor (MOS) structure.

At an end of each of beams 5a and 5b of the first fin type stacked layer structure in the third direction, there is added a function (layer selector) of selecting one of electrically conductive layers 21a, 21b, and 21c. For example, the end of each of beams 5a and 5b in the third direction has a stepped shape, and contact plug 7 is independently connected to each of electrically conductive layers 21a, 21b, and 21c in the first fin type stacked layer structure. This allows one of electrically conductive layers 21a, 21b, and 21c to be selected.

At an end of each of beams 5c and 5d of the second fin type stacked layer structure in the second direction, there is added a function (layer selector) of selecting one of electrically conductive layers 22a, 22b, and 22c. For example, the end of each of beams 5c and 5d in the second direction has a stepped shape, and contact plug 7 is independently connected to each of electrically conductive layers 22a, 22b, and 22c in the second fin type stacked layer structure. This allows one of electrically conductive layers 22a, 22b, and 22c to be selected.

The function of selecting one of electrically conductive layers 21a, 21b, and 21c in the first fin type stacked layer structure and the function of selecting one of electrically conductive layers 22a, 22b, and 22c in the second fin type stacked layer structure may be obtained by layer select transistors (see FIG. 37) LST.

In the present embodiment, the number of the first or second fin type stacked layer structures is four, but the present invention is not limited to this embodiment. That is, the number of the first or second fin type stacked layer structures may be two or more.

It is to be noted that the larger number of the first or second fin type stacked layer structures is more suitable for higher capacity of the nonvolatile semiconductor memory device.

Figure 42:
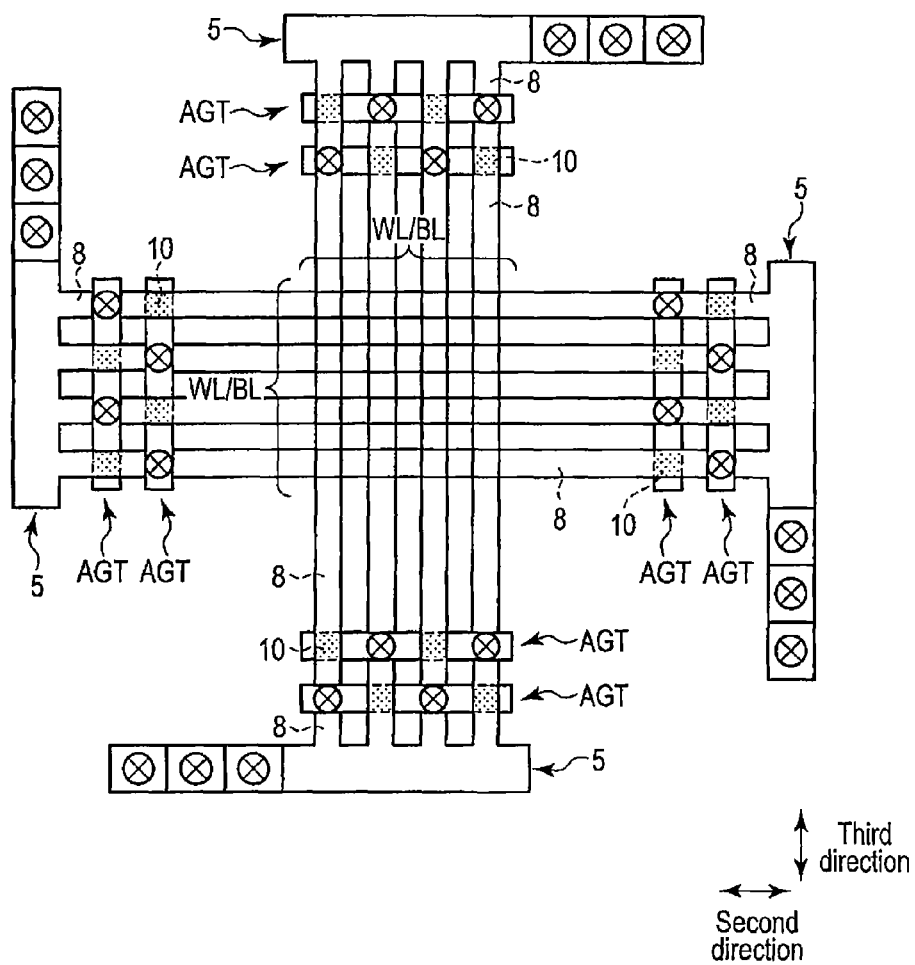

Contact plug 7 connected to two beams 5a and 5b of the first fin type stacked layer structure is located on the same side as beams 5a and 5b in the present embodiment, but may be located on a side different from beams 5a and 5b as shown in FIG. 42. Similarly, contact plug 7 connected to two beams 5c and 5d of the second fin type stacked layer structure is located on the same side as beams 5c and 5d, but may be located on a side different from beams 5c and 5d as shown in FIG. 42.

In consequence, the nonvolatile semiconductor memory device has a fylfot planar shape.

Furthermore, in the present embodiment, the layer selector (having a stepped shape in the present embodiment) is provided in each of beams 5a, 5b, 5c, and 5d connected to the first and second fin type stacked layer structures. However, the cross point type memory cell array can be operated if the layer selector is provided in one of the first and second fin type stacked layer structures as shown in FIG. 43 and FIG. 44.

Electrically conductive layers 21a, 21b, 21c, 22a, 22b, and 22c and beams 5a to 5d are preferably reduced in resistance by impurity regions or metal silicide.

6. Conclusion

According to the embodiment, the integration of a nonvolatile semiconductor memory device can be higher.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   first to third fin type stacked layer structures which each have first and second memory cells stacked in a first direction perpendicular to the surface of the semiconductor substrate and which each extend in a second direction parallel to the surface of the semiconductor substrate and which are arranged in a third direction perpendicular to the first and second directions, the third fin type stacked layer structure provided between the first and second fin type stacked layer structure;
   a first assist gate transistor which comprises a first assist gate electrode covering first and second surfaces of the first fin type stacked layer structure facing each other in the third direction and a first surface of the third fin type stacked layer structure facing the first and second surfaces of the first fin type stacked layer structure in the third direction;
   a second assist gate transistor which comprises a second assist gate electrode covering first and second surfaces of the second fin type stacked layer structure facing each other in the third direction and a second surface of the third fin type stacked layer structure facing the first and second surfaces of the second fin type stacked layer structure in the third direction; and
   a third assist gate transistor which comprises a third assist gate electrode covering the first and second surfaces of the third fin type stacked layer structure facing each other in the third direction, the second surface of the first fin type stacked layer structure, and the first surface of the second fin type stacked layer structure,
   wherein an on/off state of each of the first assist gate transistor, the second gate transistor, and the third assist gate transistor is controlled independently of each other,
   each of first to third fin type stacked layer structures comprises first and second semiconductor layers stacked in the first direction,
   the first and second memory cells are provided in corresponding to the first and second semiconductor layers,
   the first and second assist gate electrodes are arranged side by side in the third direction, and are divided from each other on the surface of the third fin type stacked layer structure facing the surface of the semiconductor substrate in the first direction,
   the first assist gate transistor has a double gate structure in the first fin type stacked layer structure, and has a single gate structure in the third fin type stacked layer structure,
   the second assist gate transistor has the double gate structure in the second fin type stacked layer structure, and has the single gate structure in the third fin type stacked layer structure, and
   the third assist gate transistor has the double gate structure in the third fin type stacked layer structure, and has the single gate structure in the first and second fin type stacked layer structures.

2. The device of claim 1,
   wherein the first and second semiconductor layers in the third fin type stacked layer structure between the first and second assist gate electrodes comprise normally-on channels which are not dependent on the potentials of the first and second assist gate electrodes, respectively, and
   the first and second semiconductor layers in the first and second fin type stacked layer structures adjacent to the third assist gate electrode in the third direction comprise the normally-on channels which are not dependent on the potential of the third assist gate electrode, respectively.

3. The device of claim 2,
   wherein the normally-on channels comprise impurity regions in the first and second semiconductor layers, respectively.

4. The device of claim 1,
   wherein the first and second semiconductor layers in the first fin type stacked layer structure adjacent to the first assist gate electrode comprise on/off channels which are dependent on the potential of the first assist gate electrode, respectively,
   the first and second semiconductor layers in the second fin type stacked layer structure adjacent to the second assist gate electrode comprise on/off channels which are dependent on the potential of the second assist gate electrode, respectively, and
   the first and second semiconductor layers in the third fin type stacked layer structure adjacent to the third assist gate electrode comprise on/off channels which are dependent on the potential of the third assist gate electrode, respectively.

5. The device of claim 1, further comprising
   a first beam which is connected to one end of each of the first to third fin type stacked layer structures in the second direction and which extends in the third direction and which comprises third and fourth semiconductor layers connected to the first and second semiconductor layers respectively.

6. The device of claim 5,
   wherein the first to third assist gate transistors are disposed between the first beam and the first and second memory cells in the first to third fin type stacked layer structures.

7. The device of claim 5,
   wherein the first to third assist gate transistors are disposed on the side of the first and second memory cells in the first to third fin type stacked layer structures opposite to the first beam.

8. The device of claim 6, further comprising
   a stack structure row which comprises the first to third fin type stacked layer structures; and
   an electrode array which comprises the first to third assist gate electrodes,
   wherein the electrode array has two or more rows on the stack structure row in the second direction, and
   each row of the electrode array has a layout in which each electrode skips over one or more of the stack structure rows to extend in the third direction.

9. The device of claim 7, further comprising
   a stack structure row which comprises the first to third fin type stacked layer structures; and
   an electrode array which comprises the first to third assist gate electrodes,
   wherein the electrode array has two or more rows on the stack structure row in the second direction, and
   each row of the electrode array has a layout in which each electrode skips over one or more of the stack structure rows to extend in the third direction.

10. The device of claim 5, further comprising
    a second beam which is connected to the other end of each of the first to third fin type stacked layer structures in the second direction and which extends in the third direction and which comprises third and fourth semiconductor layers connected to the first and second semiconductor layers, respectively.

11. The device of claim 5, further comprising
first to third electrodes each connected to the other end of each of the first to third fin type stacked layer structures in the second direction.

12. The device of claim 1,
wherein the first and second assist gate transistors are disposed at a first end of each of the first and second memory cells in the first to third fin type stacked layer structures in the second direction,
the third assist gate transistor is disposed at a second end of each of the first and second memory cells in the first to third fin type stacked layer structures in the second direction.

13. The device of claim 1, further comprising
a common electrode which passes through the first to third fin type stacked layer structures and which is connected to the first and second semiconductor layers.

14. The device of claim 1,
wherein each of the first to third assist gate transistors is an FET using the first and second semiconductor layers as channels.

15. The device of claim 1,
wherein each of the first and second memory cells is an FET which comprises a recording layer and a gate electrode and which uses the first and second semiconductor layers as channels and which changes in threshold in accordance with the state of the recording layer.

16. The device of claim 1, further comprising
a third semiconductor layer which is disposed between the first and second semiconductor layers and which extends in the third direction,
wherein the first memory cell is a resistance change element disposed between the first and third semiconductor layers, and the second memory cell is a resistance change element disposed between the second and third semiconductor layers.

17. The device of claim 1, further comprising
a fourth assist gate transistor which comprises a fourth assist gate electrode covering the first and second surfaces of the first fin type stacked layer structure facing each other in the third direction and the first surface of the third fin type stacked layer structure facing the first and second surfaces of the first fin type stacked layer structure in the third direction;
a fifth assist gate transistor which comprises a fifth assist gate electrode covering the first and second surfaces of the second fin type stacked layer structure facing each other in the third direction and the second surface of the third fin type stacked layer structure facing the first and second surfaces of the second fin type stacked layer structure in the third direction; and
a sixth assist gate transistor which comprises a sixth assist gate electrode covering the first and second surfaces of the third fin type stacked layer structure facing each other in the third direction, the second surface of the first fin type stacked layer structure, and the first surface of the second fin type stacked layer structure,
wherein the fourth and fifth assist gate electrodes are arranged side by side in the third direction, and are divided from each other on the surface of the third fin type stacked layer structure facing the surface of the semiconductor substrate in the first direction,
the fourth assist gate transistor has a double gate structure in the first fin type stacked layer structure, and has a single gate structure in the third fin type stacked layer structure,
the fifth assist gate transistor has the double gate structure in the second fin type stacked layer structure, and has the single gate structure in the third fin type stacked layer structure, and
the sixth assist gate transistor has the double gate structure in the third fin type stacked layer structure, and has the single gate structure in the first and second fin type stacked layer structures.

18. A nonvolatile semiconductor memory device comprising:
a semiconductor substrate;
first to third fin type stacked layer structures which each have first and second memory cells stacked in a first direction perpendicular to the surface of the semiconductor substrate and which each extend in a second direction parallel to the surface of the semiconductor substrate and which are arranged in a third direction perpendicular to the first and second directions, the third fin type stacked layer structure provided between the first and second fin type stacked layer structure;
a first assist gate transistor which comprises a first assist gate electrode covering first and second surfaces of the first fin type stacked layer structure facing each other in the third direction and a first surface of the third fin type stacked layer structure facing the first and second surfaces of the first fin type stacked layer structure in the third direction;
a second assist gate transistor which comprises a second assist gate electrode covering first and second surfaces of the second fin type stacked layer structure facing each other in the third direction and a second surface of the third fin type stacked layer structure facing the first and second surfaces of the second fin type stacked layer structure in the third direction; and
a third assist gate transistor which comprises a third assist gate electrode covering the first and second surfaces of the third fin type stacked layer structure facing each other in the third direction, the second surface of the first fin type stacked layer structure, and the first surface of the second fin type stacked layer structure,
wherein each of first to third fin type stacked layer structures comprises first and second semiconductor layers stacked in the first direction,
the first and second memory cells are provided in corresponding to the first and second semiconductor layers,
the first and second assist gate electrodes are arranged side by side in the third direction, and are divided from each other on the surface of the third fin type stacked layer structure facing the surface of the semiconductor substrate in the first direction,
the first assist gate transistor has a double gate structure in the first fin type stacked layer structure, and has a single gate structure in the third fin type stacked layer structure,
the second assist gate transistor has the double gate structure in the second fin type stacked layer structure, and has the single gate structure in the third fin type stacked layer structure, and
the third assist gate transistor has the double gate structure in the third fin type stacked layer structure, and has the single gate structure in the first and second fin type stacked layer structures,
and further comprising:
a first beam which is connected to one end of each of the first to third fin type stacked layer structures in the second direction and which extends in the third direction and which comprises third and fourth semiconductor layers connected to the first and second semiconductor layers respectively, and wherein the first to third assist gate transistors are disposed between the first beam and the first and second memory cells in the first to third fin type stacked layer structures.

19. A nonvolatile semiconductor memory device comprising:

a semiconductor substrate;

first to third fin type stacked layer structures which each have first and second memory cells stacked in a first direction perpendicular to the surface of the semiconductor substrate and which each extend in a second direction parallel to the surface of the semiconductor substrate and which are arranged in a third direction perpendicular to the first and second directions, the third fin type stacked layer structure provided between the first and second fin type stacked layer structure;

a first assist gate transistor which comprises a first assist gate electrode covering first and second surfaces of the first fin type stacked layer structure facing each other in the third direction and a first surface of the third fin type stacked layer structure facing the first and second surfaces of the first fin type stacked layer structure in the third direction;

a second assist gate transistor which comprises a second assist gate electrode covering first and second surfaces of the second fin type stacked layer structure facing each other in the third direction and a second surface of the third fin type stacked layer structure facing the first and second surfaces of the second fin type stacked layer structure in the third direction; and a third assist gate transistor which comprises a third assist gate electrode covering the first and second surfaces of the third fin type stacked layer structure facing each other in the third direction, the second surface of the first fin type stacked layer structure, and the first surface of the second fin type stacked layer structure, wherein each of first to third fin type stacked layer structures comprises first and second semiconductor layers stacked in the first direction, the first and second memory cells are provided in corresponding to the first and second semiconductor layers, the first and second assist gate electrodes are arranged side by side in the third direction, and are divided from each other on the surface of the third fin type stacked layer structure facing the surface of the semiconductor substrate in the first direction, the first assist gate transistor has a double gate structure in the first fin type stacked layer structure, and has a single gate structure in the third fin type stacked layer structure, the second assist gate transistor has the double gate structure in the second fin type stacked layer structure, and has the single gate structure in the third fin type stacked layer structure, and the third assist gate transistor has the double gate structure in the third fin type stacked layer structure, and has the single gate structure in the first and second fin type stacked layer structures, and further comprising:

a first beam which is connected to one end of each of the first to third fin type stacked layer structures in the second direction and which extends in the third direction and which comprises third and fourth semiconductor layers connected to the first and second semiconductor layers respectively, and wherein the first to third assist gate transistors are disposed between the first beam and the first and second memory cells in the first to third fin type stacked layer structures, and further comprising:

a stack structure row which comprises the first to third fin type stacked layer structures; and an electrode array which comprises the first to third assist gate electrodes, wherein the electrode array has two or more rows on the stack structure row in the second direction, and each row of the electrode array has a layout in which each electrode skips over one or more of the stack structure rows to extend in the third direction.

\* \* \* \* \*